US012610582B2

(12) United States Patent
Sharma et al.

(10) Patent No.:  US 12,610,582 B2
(45) Date of Patent:      Apr. 21, 2026

(54) MULTI-LAYERED SOURCE AND DRAIN CONTACTS FOR A THIN FILM TRANSISTOR (TFT) STRUCTURE

(71) Applicant: Intel Corporation, Santa Clara, CA (US)

(72) Inventors: Abhishek Anil Sharma, Portland, OR (US); Travis W. Lajoie, Forest Grove, OR (US); Van H. Le, Beaverton, OR (US); Timothy Jen, Portland, OR (US); Kamal H. Baloch, Portland, OR (US); Mark Armstrong, Portland, OR (US); Albert B. Chen, Portland, OR (US); Moshe Dolejsi, Portland, OR (US); Shailesh Kumar Madisetti, Portland, OR (US); Afrin Sultana, Portland, OR (US); Deepyanti Taneja, Happy Valley, OR (US); Vishak Venkatraman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 833 days.

(21) Appl. No.: 17/742,636

(22) Filed: May 12, 2022

(65) Prior Publication Data

US 2023/0369426 A1     Nov. 16, 2023

(51) Int. Cl.
| | |
|---|---|
| *H01L 29/417* | (2006.01) |
| *H01L 23/522* | (2006.01) |
| *H01L 23/528* | (2006.01) |
| *H10B 12/00* | (2023.01) |
| *H10D 30/67* | (2025.01) |

(52) U.S. Cl.
CPC ..... *H10D 30/6729* (2025.01); *H01L 23/5226* (2013.01); *H01L 23/5283* (2013.01); *H10B 12/30* (2023.02); *H10D 30/6713* (2025.01); *H10D 30/6755* (2025.01)

(58) Field of Classification Search
CPC .............. H10D 30/6729; H10D 30/67; H10D 30/6713; H10D 30/6755; H10D 30/675; H10D 30/6757; H10D 30/6715; H01L 23/5226; H01L 23/522; H01L 23/5283;
(Continued)

(56) References Cited

U.S. PATENT DOCUMENTS

| | | | | |
|---|---|---|---|---|
| 9,059,096 B2 * | 6/2015 | Guillorn | ............ | H10D 30/0227 |
| 2013/0189839 A1 * | 7/2013 | Guillorn | ............ | H10D 84/0186 |
| | | | | 257/E21.586 |

* cited by examiner

*Primary Examiner* — Nikolay K Yushin
(74) *Attorney, Agent, or Firm* — Arcane Law PLLC Techniques for forming thin film transistors (TFTs) having multilayer contact structures. An example integrated circuit includes a gate electrode, a gate dielectric on the gate electrode, a semiconductor region on the gate dielectric, and a conductive contact that contacts at least a portion of the semiconductor region. In some other cases, the conductive contact comprises a multilayer structure having at least a first material layer on the at least a portion of the semiconductor region, at least a second material layer on the first material layer, and a conductive fill material over the first and second material layers. In some other cases, the conductive contact comprises a multilayer structure having (1) a graded material layer on the at least a portion of the semiconductor region and (2) a conductive fill material over the graded material layer, wherein the graded material layer comprises a concentration gradient of a given element.

20 Claims, 15 Drawing Sheets

(58) Field of Classification Search

CPC ..... H01L 23/528; H01L 23/485; H10B 12/30;
H10B 12/00; H10B 12/315

See application file for complete search history.

212

210

218
216
214

400

MULTI-LAYERED SOURCE AND DRAIN CONTACTS FOR A THIN FILM TRANSISTOR (TFT) STRUCTURE

FIELD OF THE DISCLOSURE

The present disclosure relates to integrated circuits, and more particularly, to multilayer contact structures in thin film transistors.

BACKGROUND

As integrated circuits continue to scale downward in size, a number of challenges arise. For instance, as transistor area decreases, so too do the dimensions for interconnects made to the various transistor structures, such as gate structures, drain regions, and source regions. Structures formed in such interconnect layers may be highly affected by parasitic effects like leakage current, short channel effects, and undesired capacitance. Accordingly, there remain a number of non-trivial challenges with respect to the formation of backend structures in integrated circuits.

Figure 1A:
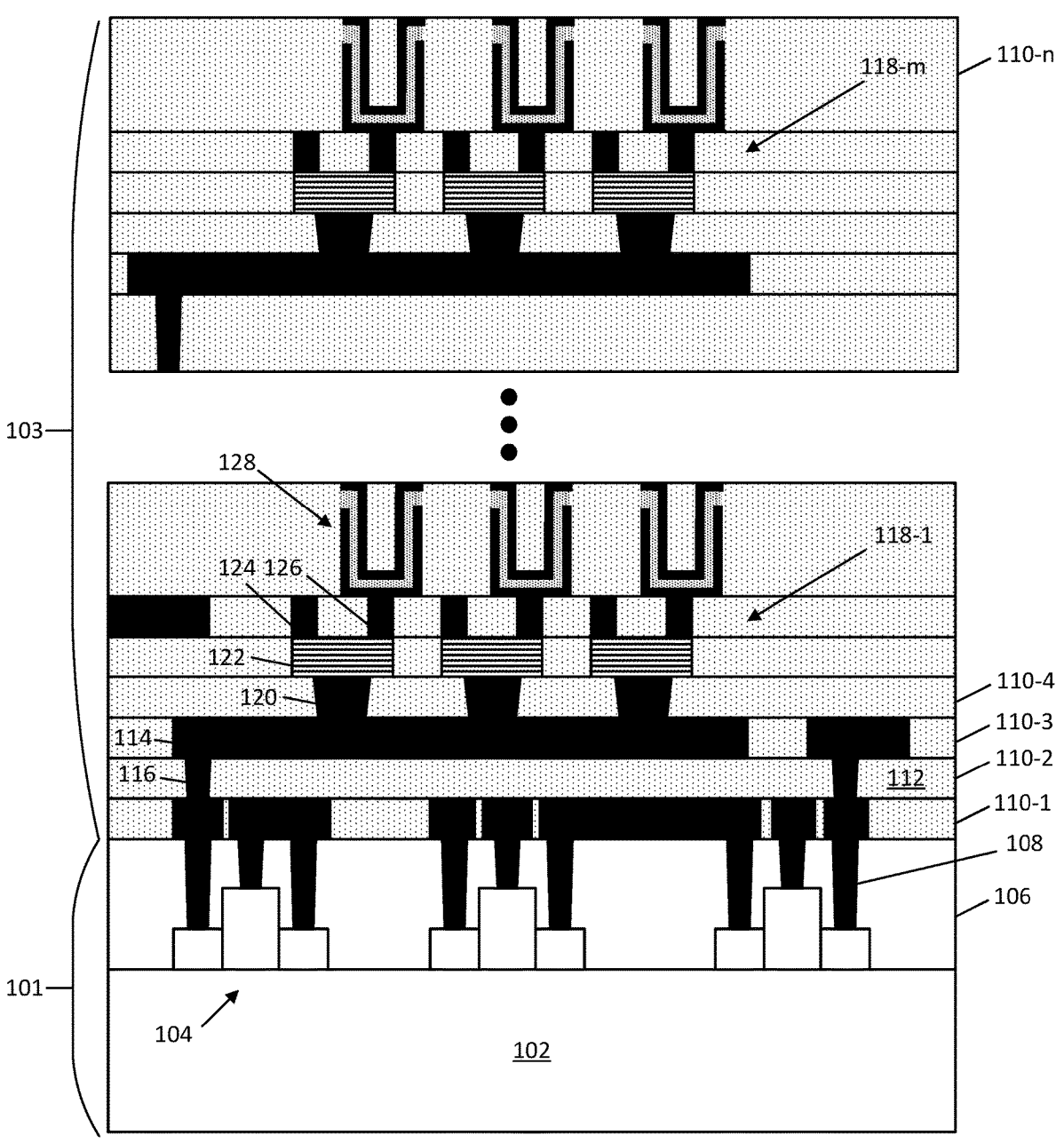
FIG. 1A is a cross-sectional view that illustrates an example portion of an integrated circuit configured with an interconnect region having tiers of memory structures that include thin film transistor (TFT) having multilayer contact structures, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein for making multi-layer contact structures to improve the performance of thin film transistors. The techniques can be used in any number of applications, but are particularly well-suited to forming backend (e.g., within the interconnect region) memory structures in which the access transistor is implemented with a TFT configured with multi-layer contact structures. According to some embodiments, a given memory structure generally includes memory cells, with each memory cell having an access device and a storage device, so as to provide a 1T-1C cell configuration. The access device may include, for example, a TFT structure, and the storage device may include a capacitor. In such cases, the TFT structure allows the capacitor to be accessed during write operations (to store a memory bit) and read operations (to read a previously-stored bit). According to some embodiments, the memory structures are arranged in a two-dimensional array within one or more interconnect layers and stacked in a vertical direction such that multiple tiers of memory structure arrays are formed within the interconnect region. Any of the given TFT structures may include one or more multilayer contacts that include various material layers between the semiconductor region (also referred to as channel region or channel layer or channel structure) of the TFT structure and a conductive fill on the various material layers. The different material layers of the contact may include, for example, semiconductor layers similar to the semiconductor material of the semiconductor region in order to improve certain properties of the TFT structure, such as leakage current and short channel effects. Numerous variations and embodiments will be apparent in light of this disclosure.

General Overview

As previously noted above, there are a number of non-trivial challenges with respect to forming backend structures within a given interconnect region of an integrated circuit. For example, the formation of highly conductive contacts in such close proximity to one another and to the gate electrode can cause problems with leakage current and parasitic capacitance. Additionally, short channel effects caused by very small effective gate lengths between the contacts (even in the case of a backside gate configuration) can degrade the transistor performance. The high bandgap transition that occurs between the semiconductor region and the contacts also increased the contact resistance and slows the speed of the transistor.

Thus, and in accordance with some embodiments of the present disclosure, techniques are provided herein to form a thin film transistor (TFT) having a multilayer contact structure to tune the transistor performance and reduce some or all of the issues noted above. The TFT can be used, for example, in a backend memory structure that may be one memory structure of an array of similar memory structures formed within various levels of interconnect layers over semiconductor devices (e.g., transistors) of a previously-formed device layer. Any kind of memory structure configuration can be used, such as those that provide dynamic random-access memory (DRAM). According to some embodiments, a TFT structure includes a gate electrode, a gate dielectric over the gate electrode (for a backside gate configuration), a semiconductor or channel region over the gate dielectric, and one or more contacts to the semiconductor region that act as source or drain regions for the transistor. The one or more contacts include multiple different layers. Such a contact configuration may provide different advantages. For example, and according to some embodiments, a first layer of a given contact may be formed directly on an underlying semiconductor (channel) region and contain similar semiconductor material to provide a smooth or graded or otherwise less severe bandgap transition, relative to a contact not having that first layer. Additional material layers may be formed over the first layer with increasing (or decreasing) concentrations of certain elements to confer higher conductivity in subsequently formed layers. A final conductive fill may be provided to complete the contact and act as the most conductive portion of the contact. Since each of the layers of the contact can have their material composition adjusted individually, the overall stack can be adjusted to have different carrier mobilities (or more generally conductivity) between the layers, and/or different doping profiles between the layers.

According to an embodiment, an integrated circuit is provided that includes a gate electrode, a gate dielectric on the gate electrode, a semiconductor region on the gate dielectric, and a conductive contact that contacts at least a portion of the semiconductor region. The conductive contact has a multilayer structure including at least a first material layer on the at least a portion of the semiconductor region, at least a second material layer on the first material layer, and a conductive fill material over the first and second material layers. The integrated circuit may further includes a passivation layer over the semiconductor region, such that the conductive contact extends through an entire thickness of the passivation layer. In such cases, the passivation layer may include, for instance, aluminum and oxygen. In some cases, the conductive contact is a first conductive contact of a thin film transistor (TFT) structure, and the TFT structure comprises a second conductive contact that contacts at least a portion of the semiconductor region, wherein the second conductive contact comprises a same or otherwise similar multilayer structure as the first conductive contact. In any such cases, the semiconductor region and the first material layer may each include a plurality of same elements, wherein one of the elements has a higher concentration in the first material layer compared to the semiconductor region. For instance, in some such cases, the semiconductor region includes, for instance, oxygen, indium, gallium, and zinc. In one such case, the first material layer comprises oxygen, indium, gallium, and zinc, with a higher concentration of indium or gallium compared to the semiconductor region. In one such case, the second material layer comprises oxygen, indium, gallium, and zinc, with a higher concentration of indium or gallium compared to the first material layer. The conductive fill can be, for example, a metal. In any such cases, the first material layer and the second material layer may each have a thickness, for example, between about 0.5 nm and about 10 nm. In some cases, each of the gate electrode, the gate dielectric, the semiconductor region on the gate dielectric, and the conductive contact is part of a transistor structure that is part of an array of transistor structures of a memory structure within an interconnect structure.

According to another embodiment, an integrated circuit includes a plurality of semiconductor devices, an interconnect region above the plurality of semiconductor devices and including a plurality of stacked interconnect layers, and a thin film transistor (TFT) structure across one or more interconnect layers of the plurality of stacked interconnect layers. The TFT structure includes a gate electrode, a gate dielectric on the gate electrode, a semiconductor region on the gate dielectric, and a conductive contact that contacts at least a portion of the semiconductor region. The conductive contact includes a multilayer structure having at least a first material layer on the at least a portion of the semiconductor region, at least a second material layer on the first material layer, and a conductive fill material over the first and second material layers.

According to another embodiment, an integrated circuit includes a plurality of semiconductor devices, an interconnect region above the plurality of semiconductor devices and having a plurality of stacked interconnect layers, and a thin film transistor (TFT) structure across one or more interconnect layers of the plurality of stacked interconnect layers. The TFT structure includes a gate electrode, a gate dielectric on the gate electrode, a semiconductor layer on the gate dielectric, and a conductive contact that contacts at least a portion of the semiconductor layer. The conductive contact includes a multilayer structure having a graded material layer on the at least a portion of the semiconductor region and a conductive fill material over the graded material layer. In an example, the graded material layer includes a concentration gradient of a given element having a highest concentration at an interface with the conductive fill and a lowest concentration at an interface with the semiconductor region. In another example, the graded material layer includes a concentration gradient of a given element having a lowest concentration at an interface with the conductive fill and a highest concentration at an interface with the semiconductor region.

According to another embodiment, a method of forming an integrated circuit includes forming a gate electrode on an underlying interconnect layer within an interconnect region over a plurality of semiconductor devices; forming a gate dielectric on the gate electrode; forming a semiconductor region on the gate dielectric; forming one or more dielectric layers over the semiconductor region; etching a recess through the one or more dielectric layers such that the recess exposes at least a portion of the semiconductor region; forming a first material layer within the recess and contacting the at least a portion of the semiconductor region; forming a second material layer on the first material layer within the recess; and forming a conductive fill within a remaining volume of the recess.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX or EDS); secondary ion mass spectrometry (SIMS); time-of-flight SIMS (ToF-SIMS); atomic probe imaging or tomography (APT); local electrode atom probe (LEAP) techniques; 3D tomography; or high resolution physical or chemical analysis, to name a few suitable example analytical tools. For instance, in some example embodiments, such tools may indicate the presence of compositionally different material layers making up any of the contacts of any backend TFT structure. Electron scattering techniques, such as EDS, may be used to determine material composition of each of the different layers of the contact and determine that different material layers have been used, and/or that a material gradient has been used. In some examples, APT may be used to determine thicknesses of each of the various material layers within the contact.

It should be readily understood that the meaning of "above" and "over" in the present disclosure should be interpreted in the broadest manner such that "above" and "over" not only mean "directly on" something but also include the meaning of over something with an intermediate feature or a layer therebetween. The meaning of "on" or "directly on" in the present disclosure should be interpreted to mean something that is on something else with no intermediate feature or layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The integrated circuit or structure may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer. Example layers include, for instance, a liner or barrier layer (e.g., a relatively thin layer of tantalum nitride), an etch stop layer (e.g., a relatively thin layer of silicon nitride), an interconnect layer (e.g., a relatively thick layer that includes dielectric material and one or more conductive interconnect features and/or active devices and/or passive devices), and a device layer (e.g., a relatively thick layer that includes metal oxide semiconductor field effect transistors or MOSFETs along with dielectric materials and conductive materials).

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

FIG. 1A is a cross-sectional view that illustrates an example portion of an integrated circuit having an interconnect region 103 above a device region 101 that includes a plurality of semiconductor devices 104, in accordance with an embodiment of the present disclosure. As can be seen, the interconnect region 103 includes a number of memory cells each having access transistors, which are configured with multilayer contact structures, as will be explained in turn with further reference to FIGS. 2A-2J. The semiconductor devices 104 in this example are non-planar metal oxide semiconductor (MOS) transistors, such as tri-gate or gate-all-around (GAA) transistors, although other transistor topologies and types can also benefit from the techniques provided herein, as will be appreciated (e.g., planar transistors, thin film transistors, or any other transistors to which contact can be made). The semiconductor devices 104 may be configured for any number of functions, such as logic or compute transistors, input/output (I/O) transistors, access or switching transistors, and/or radio frequency (RF) transistors, to name a few examples.

According to some embodiments, in addition to semiconductor devices 104, device region 101 may include, for example, one or more other layers or structures associated with the semiconductor devices 104. For example, device region 101 can also include a substrate 102 and one or more dielectric layers 106 that surround active and/or conductive portions of the semiconductor devices 104. Device region 101 may also include one or more conductive contacts 108 that provide electrical contact to transistor elements such as gate structures, drain regions, or source regions. Conductive contacts 108 may include, for example, tungsten, ruthenium, or copper, although other metal or metal alloy materials may be used as well. Some embodiments may include a local interconnect (e.g., via or line) that connects a given contact 108 to an interconnect feature within the interconnect region 103.

Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material from and/or upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, backside processing is used to remove substrate 102 and form additional backside interconnect layers. The techniques provided herein may be used to provide multi-tier memory structures within frontside and/or backside interconnect structures, as will be appreciated.

Interconnect region 103 includes any number (n) of interconnect layers 110-1 to 110-n stacked over one another. Each interconnect layer can include a dielectric material 112 along with one or more different conductive interconnect features (e.g., vias and lines), active devices (e.g., transistors, diodes), and/or passive devices (e.g., capacitors, resistors, inductors). Dielectric material 112 can be any dielectric, such as silicon oxide, silicon oxycarbide, silicon nitride, or silicon oxynitride. Dielectric material 112 may be formed using any known dielectric deposition technique such as chemical vapor deposition (CVD), plasma-enhanced chemical vapor deposition (PECVD), flowable CVD, spin-on dielectric, or atomic layer deposition (ALD). The one or more conductive interconnect features can include any number of conductive traces 114 and conductive vias 116 arranged in any pattern across the interconnect layers 110-1 to 110-n to carry signal and/or power voltages to/from the various semiconductor devices 104. As used herein, conductive vias, such as conductive via 116, extend at least partially through an interconnect layer to connect between conductive traces on an upper interconnect layer and/or a lower interconnect layer, while conductive contacts, such as conductive contact 108, extend at least partially through a portion of dielectric layer 106 or any interconnect layer to contact one or more transistor elements. Interconnect layers are sometimes called metallization layers (e.g., such as M0 through M15). In some embodiments, a given metallization layer may include two adjacent interconnect layers (e.g., one interconnect layer above another interconnect layer, separated by a relatively thin etch stop layer) with vias in one of the layers and metal traces in the other of the two layers.

Any of conductive traces 114 and conductive vias 116 can include any number of conductive materials, with some examples including copper, ruthenium, tungsten, cobalt, molybdenum, titanium, tantalum, and alloys thereof. In some example cases, any of conductive traces 114 and conductive vias 116 include a relatively thin liner or barrier, such as manganese, ruthenium, titanium nitride, titanium silicide, tungsten carbo-nitride (WCN), physical vapor deposited (PVD) or ALD tungsten, tantalum, or tantalum nitride, to name a few examples.

Note that each of the various conductive vias 116 and conductive contacts 108 are shown with tapered profiles to indicate a more natural appearance due to the etching process used to form the openings, although such tapering may not always be present. Any degree of tapering may be observed depending on the etch parameters used and the thickness of the dielectric layer being etched through. Furthermore, conductive vias may be stacked one over the other through different dielectric layers of interconnect region 103. However, in some examples, a single via recess may be formed through more than one dielectric layer yielding a taller, more tapered conductive via that extends through two or more dielectric layers (e.g., a deep via or supervia).

As can be further seen in this example embodiment, interconnect region 103 also includes tiers of memory arrays 118-1-118_m_, with each of the m memory arrays having any number of backend memory structures and/or capacitors. Each of the memory arrays may extend vertically across any number of interconnect layers (e.g., one, two or many). In some embodiments, a given memory array 118-1 includes a plurality of TFT structures 120 formed over a given conductive trace, such as conductive trace 114, extending in a first direction. According to some embodiments, a conductive via 122 extends between each TFT structure 120 along the illustrated row of TFT structures and conductive trace 114. In some other embodiments, the TFT structures 120 along the same row sit directly on conductive trace 114.

One or more second conductive traces 124 may each couple to a corresponding contact of a given TFT structure 120. Second conductive traces 124 may extend in a second direction orthogonal to the first direction. Conductive trace 114 may be, for example, a wordline of several parallel wordlines that extend beneath any number of TFT structures 120. Second conductive traces 124 may represent, for example, parallel bitlines extending into and out of the page and each connecting to the contacts of any number of TFT structures 120. TFT structures 120 can include any number of layers to form a transistor with a first source or drain region coupled to a corresponding second conductive trace 124 and a second source or drain region coupled to a conductive via 126. According to some embodiments, conductive via 126 acts as a conductive bridge between the second source or drain contact of a given TFT structure 120 and an electrode of its associated capacitor 128. Capacitors 128 may be, for example, metal-insulator-metal (MIM)

capacitors having a U-shaped cross-section as shown, although other capacitor structures may be used as well (e.g., pillar-based capacitors with a dielectric layer sandwiched between an inner conductive core and an outer conductive layer, flat capacitors with a dielectric layer sandwiched between upper and lower conductive layers or between left and right conductive layers). Each capacitor 128 in tandem with its associated TFT structure 120 represents a single memory structure or memory cell for holding a single bit (e.g., a logic zero or one depending on the charge state of capacitor 128). This example shows TFT structure 120 contained within a single interconnect layer, but other embodiments may have TFT structures that extend vertically through two or more such interconnect layers. Further note that, in some embodiments, there is a relatively thin etch stop layer between adjacent interconnect layers, such as between any adjacent interconnect layers 110. Such etch stops may have a thickness in the range of, for example, 2 nm to 10 nm, and may include, for instance, silicon nitride, silicon oxynitride, or silicon oxycarbonitride, to name few examples.

As discussed above, the contacts of any given TFT structure 120 can have negative parasitic effects due to their close proximity to each other and to the lower gate electrode. According to some embodiments, TFT structures 120 include contacts having a multi-layer structure with one or more semiconductor layers that allows for tuning the device performance and reducing some of the parasitic short channel and capacitive effects. Further details of the fabrication process for a single TFT structure, including the formation of the multilayered contacts, are provided herein with respect to FIGS. 2A-2J.

Figure 1B:
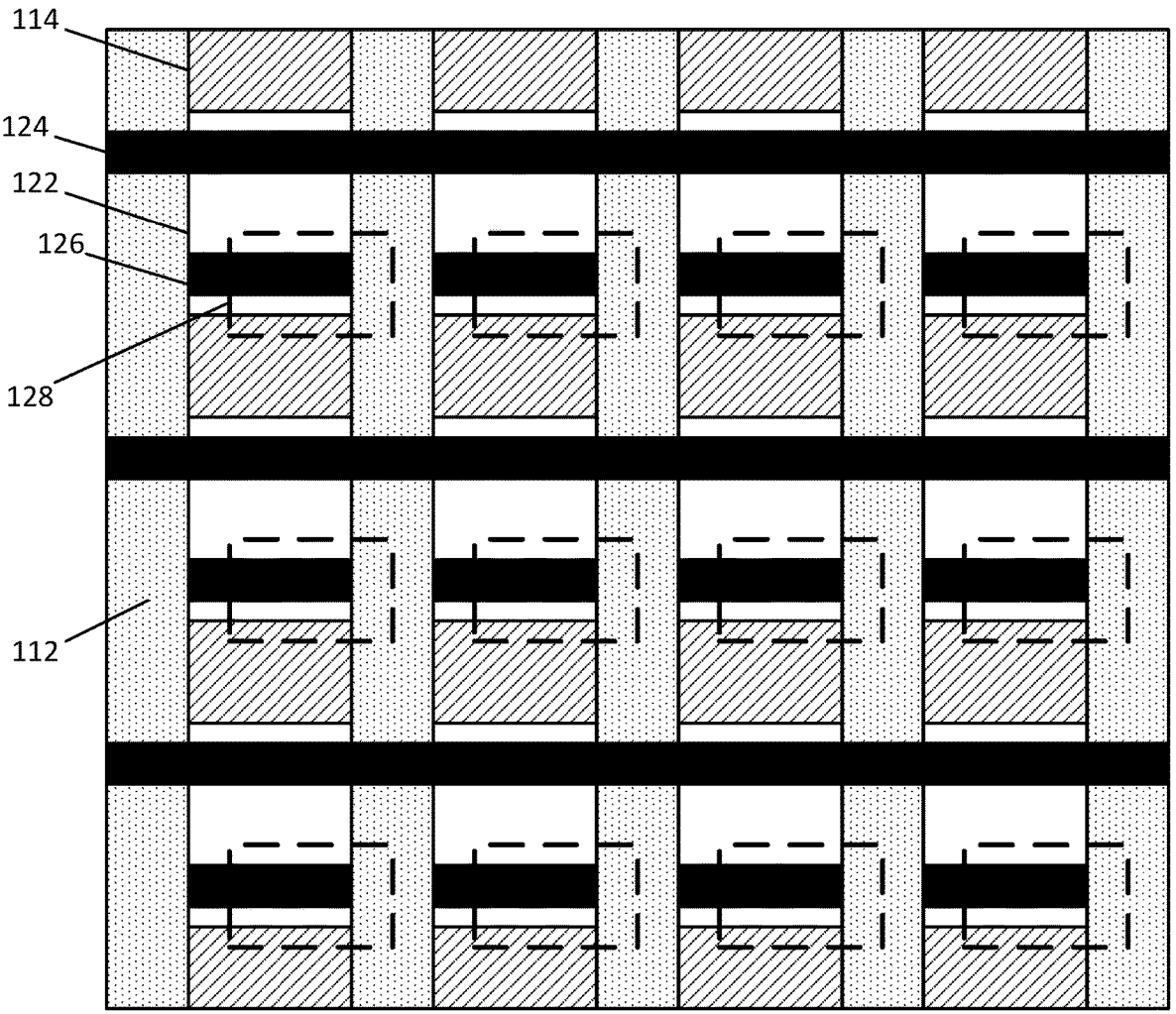
FIG. 1B is a plan view of an array of memory structures and generally illustrates structures formed across different interconnect layers, in accordance with an embodiment of the present disclosure.

FIG. 1B illustrates a plan view across an array of TFT-based memory structures, according to an embodiment. Many of the illustrated structures are located on or across different interconnect layers as shown in FIG. 1A but are all shown together in a single view in FIG. 1B for clarity. A plurality of parallel conductive traces 114 are present within a first interconnect layer and surrounded by dielectric material 112 within the first interconnect layer. Note in this view that the conductive traces 114 each run from the top to the bottom of the page (or vice-versa). According to some embodiments, dielectric material 112 is also present between any other structures on other interconnect layers, such as between adjacent TFT structures 120 and/or between adjacent capacitors 128.

TFT structures 120 are formed as individual islands in an array across the plurality of conductive traces 114, according to some embodiments. In this way, conductive traces 114 act as wordlines with each conductive trace 114 coupled to the gate(s) of one or more TFT structures 120 arranged along its length. In this example view, there are four conductive traces 114 shown, and there are three TFT structures 120 along the length of each conductive trace 114.

According to some embodiments, one of the source or drain contacts of TFT structures 120 in a same row are coupled to a same second conductive trace 124 that extends in a different direction (e.g., orthogonally) compared to conductive trace 114. A plurality of parallel second conductive traces 124 may each extend across any number of TFT structures and be coupled to the source or drain contact on each of the TFT structures in the row. In this example view, there are three conductive traces 124 shown, and there are four TFT structures 120 along the length of each conductive trace 124. Accordingly, any given TFT structure 120 of the array has its gate coupled to one of the conductive traces 114 (e.g., wordline) and one of its source or drain contacts coupled to one of the second conductive traces 124 (e.g., bitline) such that each of the TFT structures are individually addressable, in some examples. The other source or drain contact on each TFT structure 120 is coupled to its own conductive via 126, which acts like a conductive bridge between the TFT structure 120 and its corresponding capacitor 128. In an embodiment, TFT structures 120 are formed in a second interconnect layer over the first interconnect layer, second conductive traces 124 and conductive vias 126 are formed in a third interconnect layer over the second interconnect layer, and capacitors 128 are formed in a fourth interconnect layer over the third interconnect layer. In some other embodiments, note that one or more of TFT structures 120 may be a dummy structure (e.g., not connected into a working memory cell or otherwise non-functional).

Fabrication Methodology

FIGS. 2A-2J are cross-sectional views that collectively illustrate an example process for forming a portion of an interconnect region of an integrated circuit. According to an embodiment, the fabrication process for forming a 1T-1C memory structure in the interconnect region is provided. Each figure shows an example structure that results from the process flow up to that point in time, so the depicted structure evolves as the process flow continues, culminating in the structure shown in FIG. 2J, which provides a detailed view of a single example TFT-based memory structure. The TFT-based memory structure may be one structure of a plurality of such memory structures across an array of memory structures (e.g., a single tier of memory structures). Each structure in the array may be formed together using the processes detailed here. Furthermore, as noted above, multiple tiers of memory arrays may be formed in the interconnect region. The TFT-based memory structures of each tier may be formed using the same general processes discussed here.

The TFT-based memory structure may be part of an overall integrated circuit (e.g., such as a processor or memory chip, or a system-on-chip) that includes, for example, digital logic cells and/or memory cells and analog mixed signal circuitry. Example materials and process parameters are given, but other materials or parameters will be appreciated in light of this disclosure.

Figure 2A:
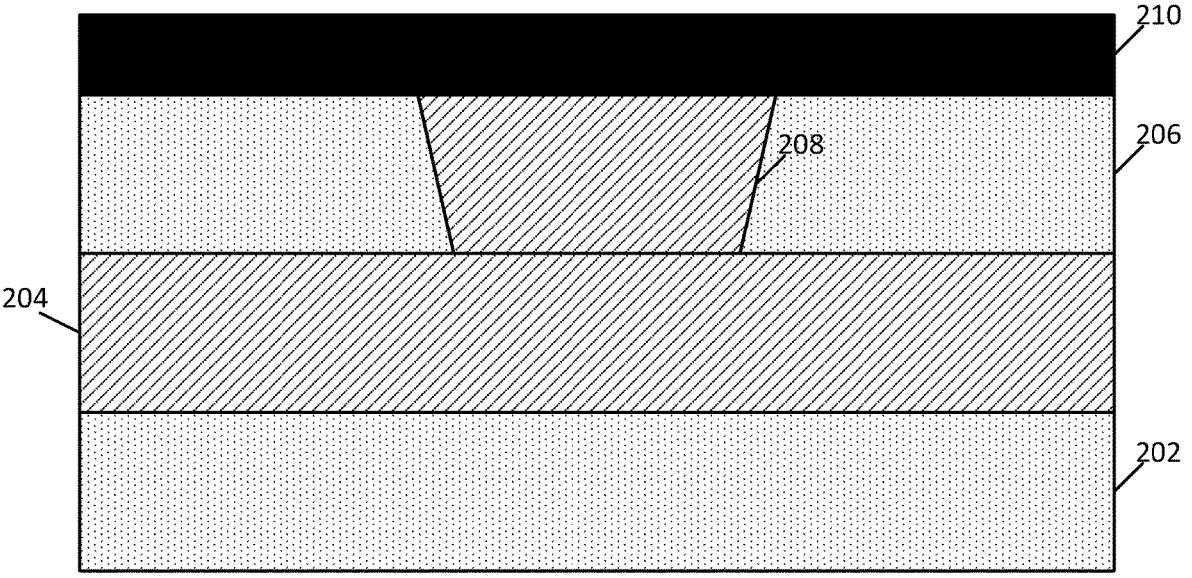
FIGS. 2A-2J are cross-sectional views that collectively illustrate an example process for forming a TFT having a multi-layer contact structure, in the context of a memory structure, in accordance with an embodiment of the present disclosure.

FIG. 2A is a cross-sectional view taken through some interconnect layers of a plurality of stacked interconnect layers. Accordingly, any number of lower interconnect layers 202 may be at any position within interconnect region 103. Interconnect layers 202 may include any conductive traces and/or vias within any number of dielectric layers. According to some embodiments, a first interconnect layer includes a first conductive trace 204. As discussed above, first conductive trace 204 may be one wordline of a plurality of wordlines that run parallel to one another in the first interconnect layer. Other memory control/access schemes can be used as well.

First conductive trace 204 may be formed, for example, by first forming a recess within a surrounding dielectric layer (not shown) followed by filling the recess with a conductive material, such as copper, that is deposited using any one of electroplating, electroless plating, CVD, or PECVD, to name a few examples. After deposition of the conductive material within the recess, a polishing process may be performed using, for example, chemical mechanical polishing (CMP) to planarize the given layer down to a top surface of first conductive trace 204. In some embodiments, a thin barrier layer is conformally deposited (e.g., via ALD or CVD) first along the inner surfaces of the recess prior to the deposition of the copper or other conductive fill material.

The thin barrier layer may include, for example, tantalum or titanium, or a nitride of these, or some other electromigration inhibitor.

According to some embodiments, another dielectric layer 206 is deposited over first conductive trace 204, and a conductive via 208 is formed within dielectric layer 206 such that conductive via 208 is on first conductive trace 204. In some embodiments, conductive via 208 is one via of a plurality of such conductive vias formed within dielectric layer 206 along a length of first conductive trace 204 and along a length of other such conductive traces parallel to first conductive trace 204.

According to some embodiments, a gate electrode 210 is deposited on dielectric layer 206 and a top surface of conductive via 208. In some other embodiments, dielectric layer 206 is omitted such that gate electrode 210 is deposited directly on first conductive trace 204. In either case, gate electrode 210 is conductively coupled to first conductive trace 204 (either directly or through conductive via 208). As will be appreciated, this particular example refers to a backside-gate configuration, where the gate structure of the access device being formed is on a backside of the device, and the source and drain contacts of that device are on a frontside of the device. Such a configuration facilitates connectivity within a given memory array (e.g., sandwiching a TFT device between a wordline and a bitline), but other connectivity schemes may be used if device density constraints allow for same.

Gate electrode 210 may include any suitable conductive material such as polysilicon, a metal, or a metal alloy. Example suitable metals or metal alloys include aluminum, tungsten, cobalt, molybdenum, ruthenium, titanium, tantalum, copper, and carbides and nitrides thereof. Note that gate electrode 210 may contain multiple layers, such as an inner plug or fill metal, with surrounding or outer work function material. According to some embodiments, gate electrode 210 includes one or more n-type work function metals such as platinum, gold, palladium, or cobalt. In some embodiments, gate electrode 210 includes one or more p-type work function metals such as titanium, titanium nitride, tantalum, or tantalum nitride.

Figure 2B:
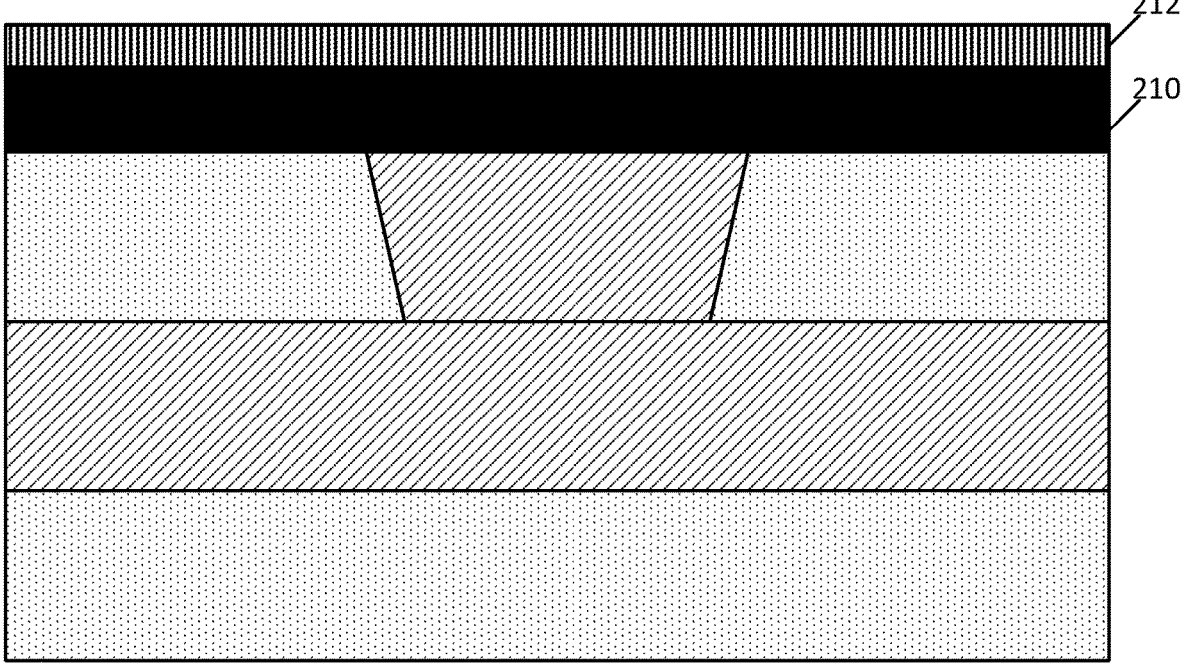

FIG. 2B is a cross-sectional view of the structure depicted in FIG. 2A after formation of a gate dielectric 212 over gate electrode 210. Gate dielectric 212 may be deposited, for example, to a thickness between about 2 nm and about 10. In some embodiments, gate dielectric 212 has a thickness up to about 50 nm. Gate dielectric 212 may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide. In some cases, gate dielectric 212 may include multiple layers, such as a first layer of high-k material (e.g., hafnium oxide) on the gate electrode 210 and a second layer of lower-k oxide between the first layer and the channel layer that is ultimately formed over gate dielectric 212. The lower-k oxide may be, for instance, silicon oxide or an oxide of the channel layer material. Gate dielectric 212 may have a thickness between about 1 nm and about 10 nm.

Figure 2C:
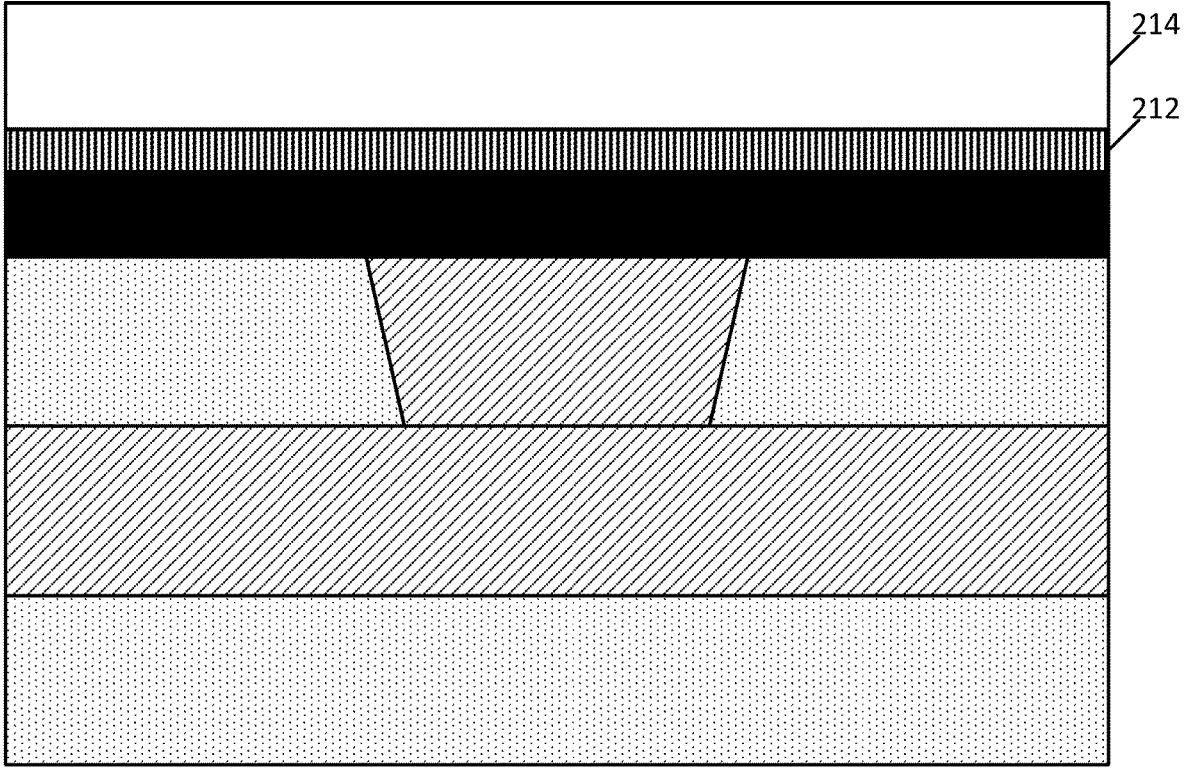

FIG. 2C is a cross-sectional view of the structure depicted in FIG. 2B after the formation of a semiconductor region 214 (also referred to as a channel layer or channel region) over gate dielectric 212. Semiconductor region 214 may include any suitable semiconductor material, such as silicon or any III-V or II-VI materials exhibiting semiconducting qualities. According to some embodiments, semiconductor region 214 includes any of indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$ (silicon-boron-nitrogen), stanene, phosphorene, molybdenite, poly-III-V like indium arsenide (InAs), indium gallium arsenide (InGaAs), indium phosphide (InP), amorphous indium gallium zinc oxide (InGaZnO, sometimes referred to as a-IGZO), crystal-like InGaZnO (sometimes referred to as c-IGZO), gallium zinc oxynitride (GaZnON), zinc oxynitride (ZnON), molybdenum and sulfur, a group-VI transition metal dichalcogenide, or a c-axis aligned crystal (CAAC) layer. Semiconductor region 214 may have a total thickness between about 5 nm and about 16 nm with any number of deposited material layers.

Figure 2D:
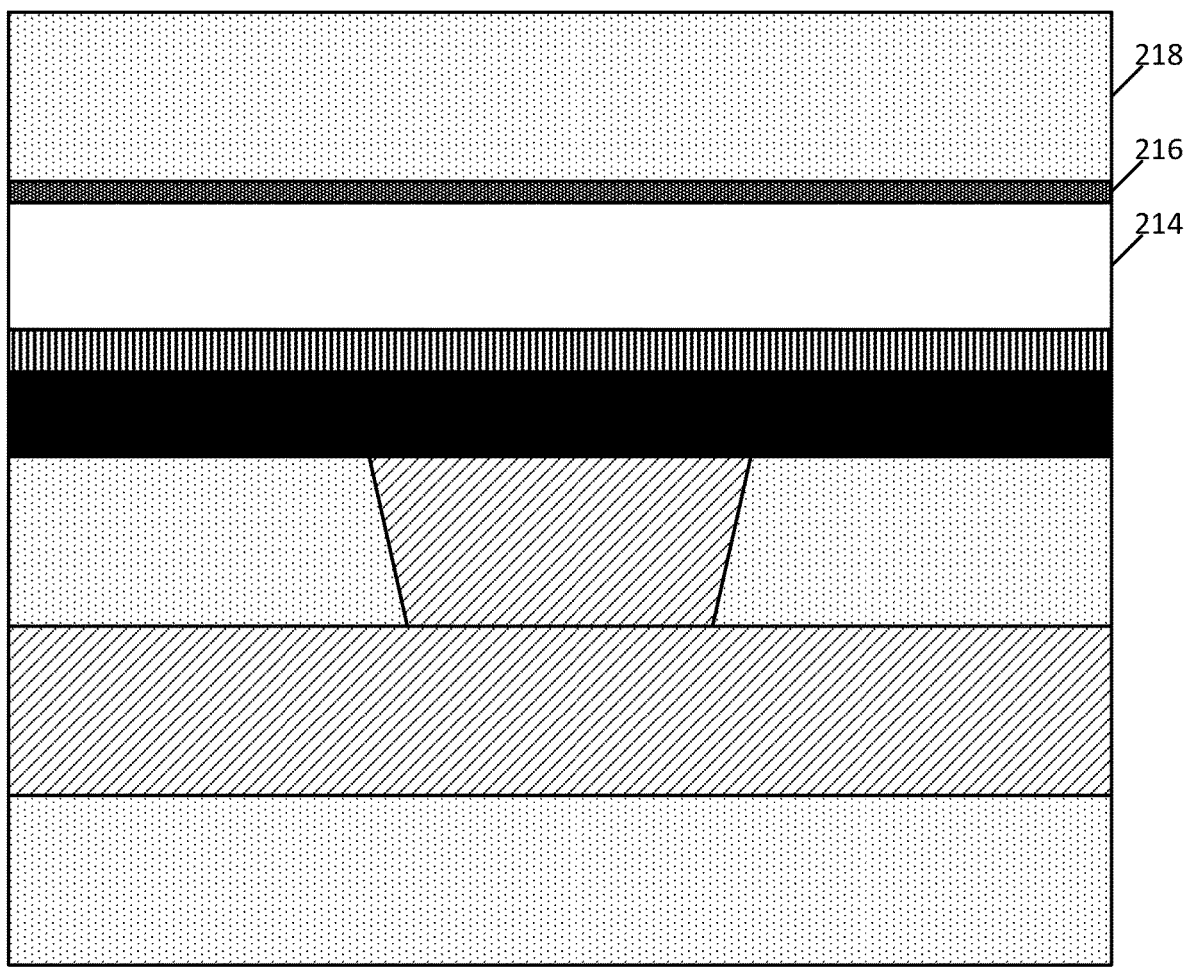

FIG. 2D is a cross-sectional view of the structure depicted in FIG. 2C after forming a passivation layer 216 and dielectric layer(s) 218. According to some embodiments, passivation layer 216 includes a dielectric material that protects the underlying semiconductor region 214. Passivation layer 216 may include, for example, aluminum oxide, although other metal oxides may be used as well. Dielectric layer(s) 218 represent any number of passivation and/or interlayer dielectrics (ILD) deposited over passivation layer 216. According to some embodiments, dielectric layer(s) 218 include the same material composition as dielectric material 112 in any interconnect layer. Dielectric layer(s) 218 may include, for instance, silicon oxide, silicon oxycarbide, silicon nitride, or silicon oxynitride, to name a few examples.

Figure 2E:
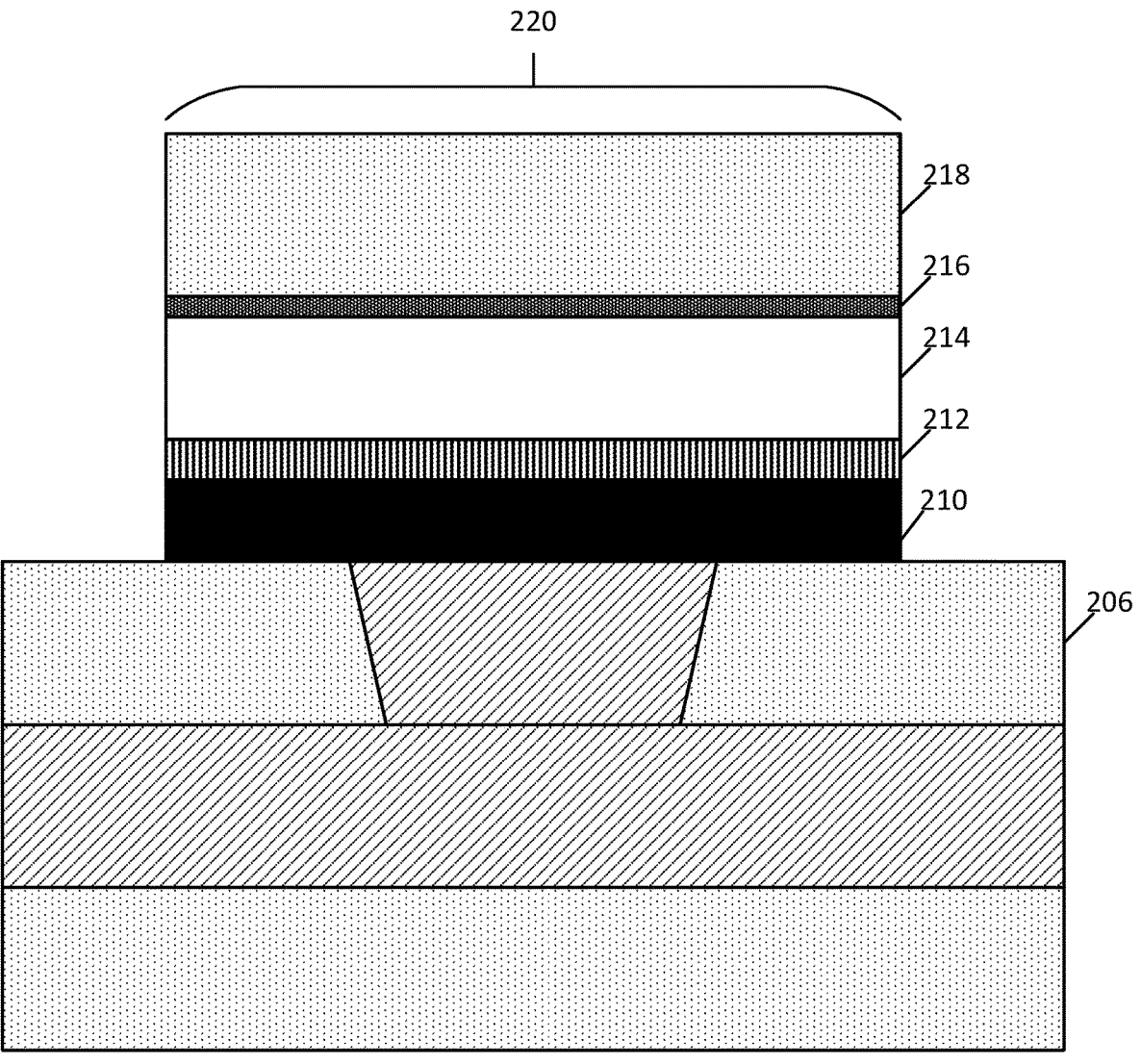

FIG. 2E is a cross-sectional view of the structure depicted in FIG. 2D after an etching process is performed to form an individual island of TFT layers 220. According to some embodiments, the etching process simultaneously forms multiple islands of TFT layers across any number of first conductive traces. An anisotropic etch may be performed to cut through a thickness of each of gate electrode 210, gate dielectric 212, semiconductor region 214, passivation layer 216, and dielectric layer(s) 218. In some embodiments, the etching process stops at a top surface of dielectric layer 206 or may stop after etching through a portion of dielectric layer 206. According to some embodiments, the etch depth at least cuts through an entire thickness of gate electrode 210. The full length of the resulting island of TFT layers 220 can vary from one embodiment to the next, but in some examples may be between about 50 nm and about 250 nm. In some embodiments, the distance between adjacent TFT layers 220 along a common first conductive trace 204 is between about 10 nm and about 50 nm.

Figure 2F:
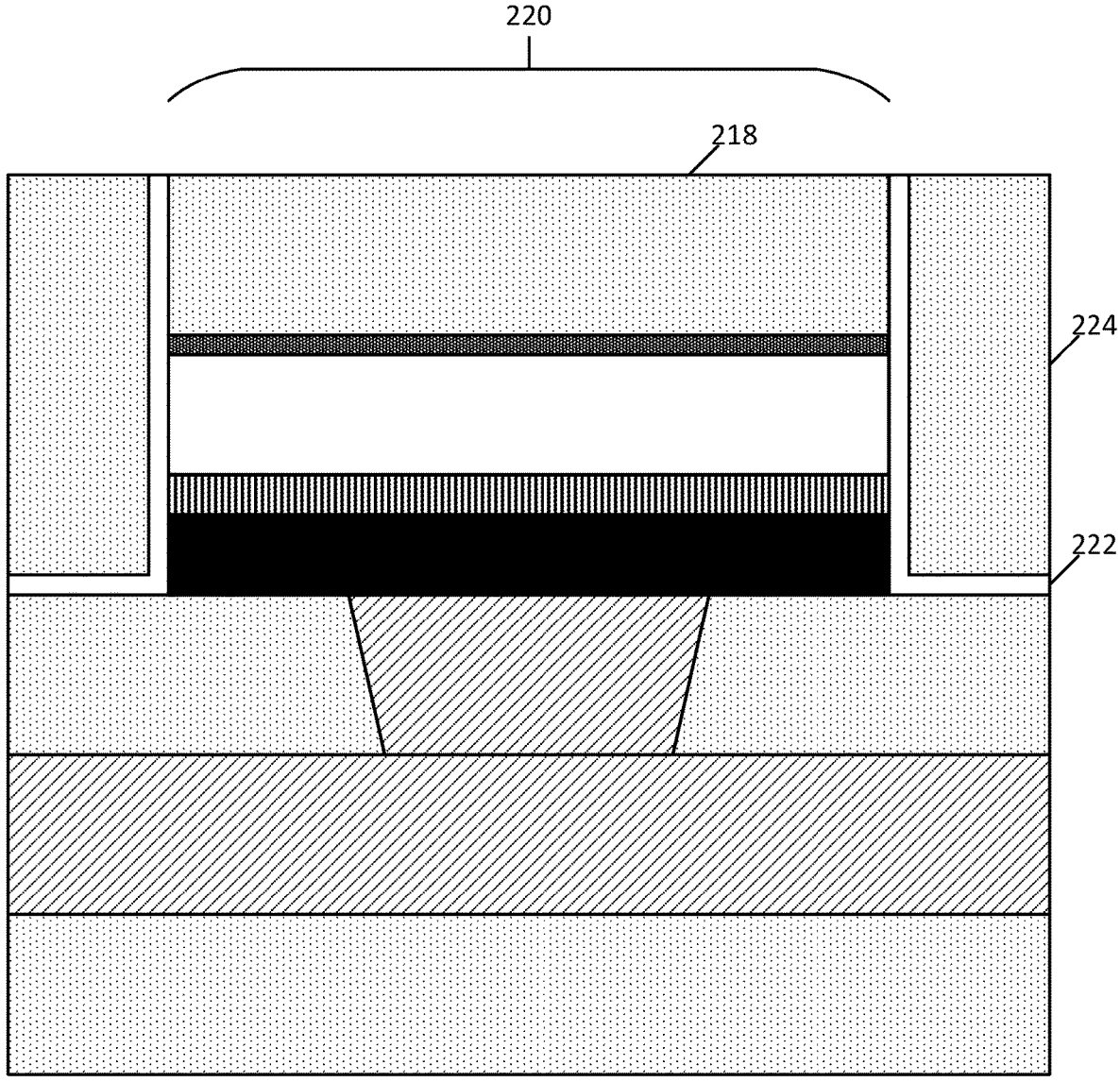

FIG. 2F is a cross-sectional view of the structure depicted in FIG. 2E following the formation of filler dielectric layers between adjacent islands of TFT layers 220, according to some embodiments. A dielectric liner 222 may be deposited over the sidewalls of TFT layers 220. According to some embodiments, dielectric liner 222 is a high-k material, such as hafnium oxide, with a thickness between about 0.5 nm and 5 nm. Other example materials for dielectric liner 222 include aluminum oxide, silicon nitride, silicon oxynitride, aluminum nitride, silicon carbide, silicon oxide, hafnium zirconium oxide, or zirconium oxide. A dielectric fill 224 may be formed within any remaining volume between adjacent islands of TFT layers 220 and over dielectric liner 222. Dielectric fill 224 may include any suitable dielectric material such as silicon oxide, or any other dielectric material used on any of the other interconnect layers. According to some embodiments, both dielectric liner 222 and dielectric fill 224 are deposited over the whole structure and then polished back using, for example, CMP to expose a top surface of dielectric layer(s) 218.

Figure 2G:
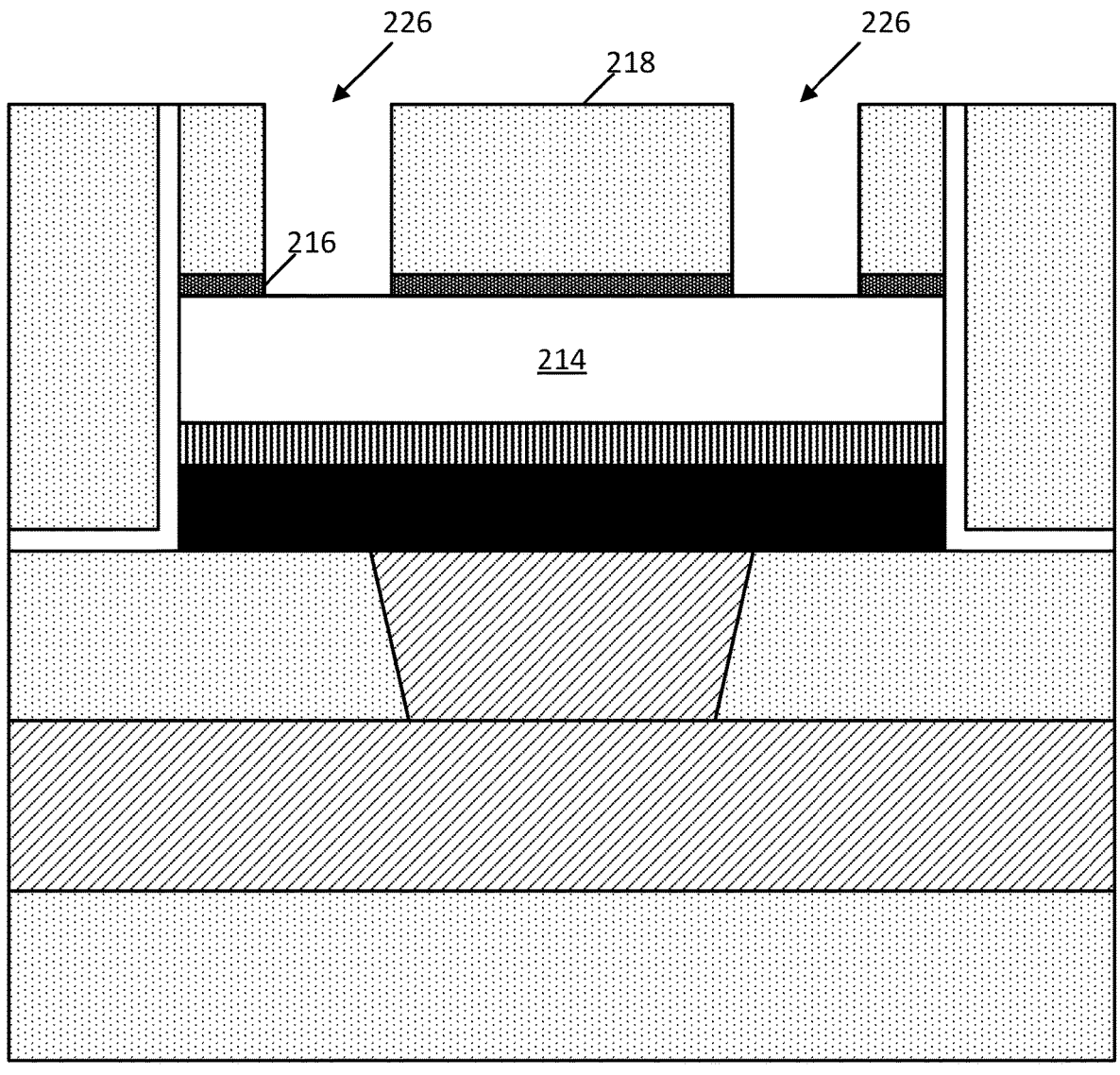

FIG. 2G is a cross-sectional view of the structure depicted in FIG. 2F following the formation of one or more contact recesses 226. According to one example, an anisotropic etching process may be performed through a thickness of at least dielectric layer(s) 218 and passivation layer 216 to expose at least a portion of semiconductor region 214. Although recesses 226 are illustrated with straight walls, it should be understood that the etching process may yield inwardly tapered sidewalls. Recesses 226 may extend out to the edges of the TFT layers in the orthogonal direction (e.g., into and out of the page).

Figure 2H:
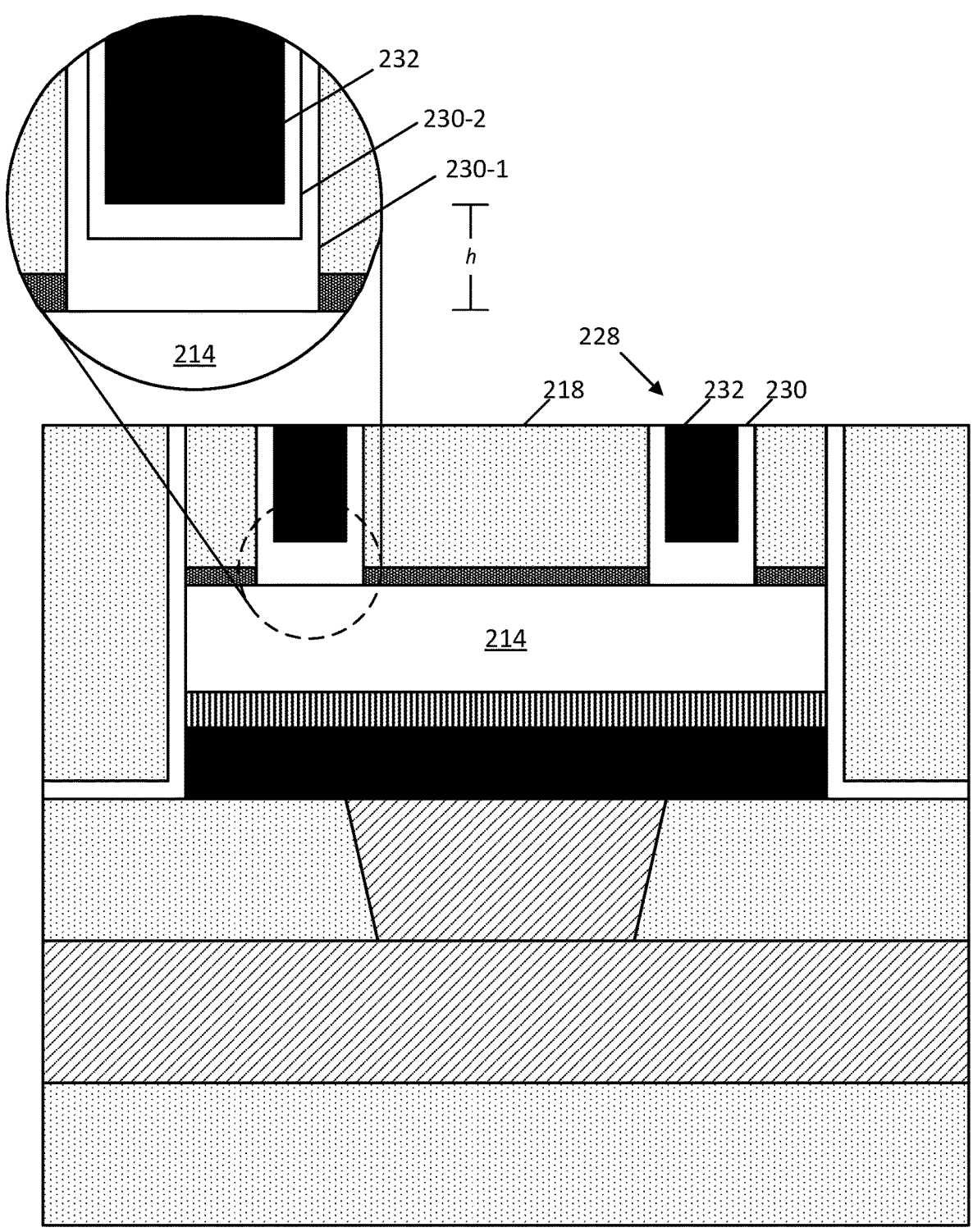

FIG. 2H is a cross-sectional view of the structure depicted in FIG. 2G following the formation of contacts 228 within contact recesses 226. According to some embodiments, contact 228 includes contact semiconductor layer(s) 230 and a metal fill 232. Contact semiconductor layer(s) 230 represent any number of formed semiconductor layers within recess 226, similar to semiconductor region 214. Accordingly, contact semiconductor layer(s) 230 may include silicon or any III-V or II-VI materials exhibiting semiconducting qualities. According to some embodiments, contact semiconductor layer(s) 230 includes metal oxide semiconductor material such as indium gallium zinc oxide (InGaZnO or IGZO), indium zinc oxide (InZnO), indium oxide (InO), or gallium zinc oxide (GaZnO), to name a few examples. According to some embodiments, contact semiconductor layer(s) 230 may include multiple formed semiconductor layers having varying properties to provide, for example, low contact resistance with semiconductor region 214, and a smoother energy bandgap transition with metal fill 232. According to some embodiments, contact semiconductor layer(s) 230 form along sidewalls of recess 226 and along a bottom surface of recess 226. The portion of contact semiconductor layer(s) 230 along the bottom surface of recess 226 may be thicker than the portion of contact semiconductor layer(s) 230 along sidewalls of recess 226.

Metal fill 232 may be any suitable interconnect contact metal, such as copper, ruthenium, tungsten, cobalt, molybdenum, titanium, tantalum, and alloys thereof. In some cases, metal fill 232 may be formed, for instance, using electroplating within the remaining volume of recess 226 following the formation of contact semiconductor layer(s) 230. Once both contact semiconductor layer(s) 230 and metal fill 232 have been formed within recess 226, they may both be polished back using, for example, CMP, to expose a top surface of dielectric layer(s) 218.

According to some embodiments, contact semiconductor layer(s) 230 includes at least semiconductor layers 230-1 and 230-2 with each layer having a different material composition and/or doping profile, as shown in the expanded illustration. Although only two layers are illustrated as part of contact semiconductor layer(s) 230, any number of layers may be deposited. Each of semiconductor layers 230-1 and 230-2 may be deposited using CVD, PVD and/or ALD. In some embodiments, the deposited semiconductor layers have similar elements to the material used in semiconductor region 214, but with differing concentrations to impart different characteristics to each layer. For example, semiconductor region 214 may include indium, gallium, zinc, and oxygen (IGZO), and semiconductor layer 230-1 may also include IGZO with a higher concentration of indium or gallium, while second layer 230-2 also includes IGZO with an even higher concentration of indium or gallium. Although this example uses IGZO, any suitable metal oxide semiconductor material may be used with differing elemental concentrations between the layers, such as any of the semiconductor materials discussed above with regards to either contact semiconductor layer(s) 230 or semiconductor region 214. In some embodiments, a topmost layer of the contact semiconductor layer(s) 230 (e.g., semiconductor layer 230-2) is highly doped and thus more conductive compared to any of the other layers of contact semiconductor layer(s) 230. In some embodiments, the topmost layer of the contact semiconductor layer(s) 230 (e.g., semiconductor layer 230-2) includes any semiconductor material or doping profile to create a narrower bandgap compared to any of the other layers of contact semiconductor layer(s) 230. In some embodiments, the topmost layer of the contact semiconductor layer(s) 230 (e.g., semiconductor layer 230-2) is thinner than any of the other layers within contact semiconductor layer(s) 230. In some examples, a total height h of contact semiconductor layer(s) 230 is between about 1 nm and about 20 nm. In some embodiments, a thickness of each of semiconductor layers 230-1 and 230-2 is between about 0.5 nm and about 10 nm.

According to some embodiments, any one or more of the various contact semiconductor layer(s) 230 can include a graded concentration of any element or elements (e.g., indium, gallium, or zinc) through a thickness of the layer. In one example, all of contact semiconductor layer(s) 230 are included in a single graded layer. In some such example embodiments, a single graded contact semiconductor layer may have a concentration gradient of a given element having a highest concentration at an interface with metal fill 232 and a lowest concentration at an interface with semiconductor region 214. In some other such example embodiments, a single graded contact semiconductor layer may have a concentration gradient of a given element having a lowest concentration at an interface with metal fill 232 and a highest concentration at an interface with semiconductor region 214. And still other embodiments may include a first concentration transitioning from highest to lowest and a second concentration transitioning from lowest to highest, with both transitions proceeding in the same direction.

Figure 2I:
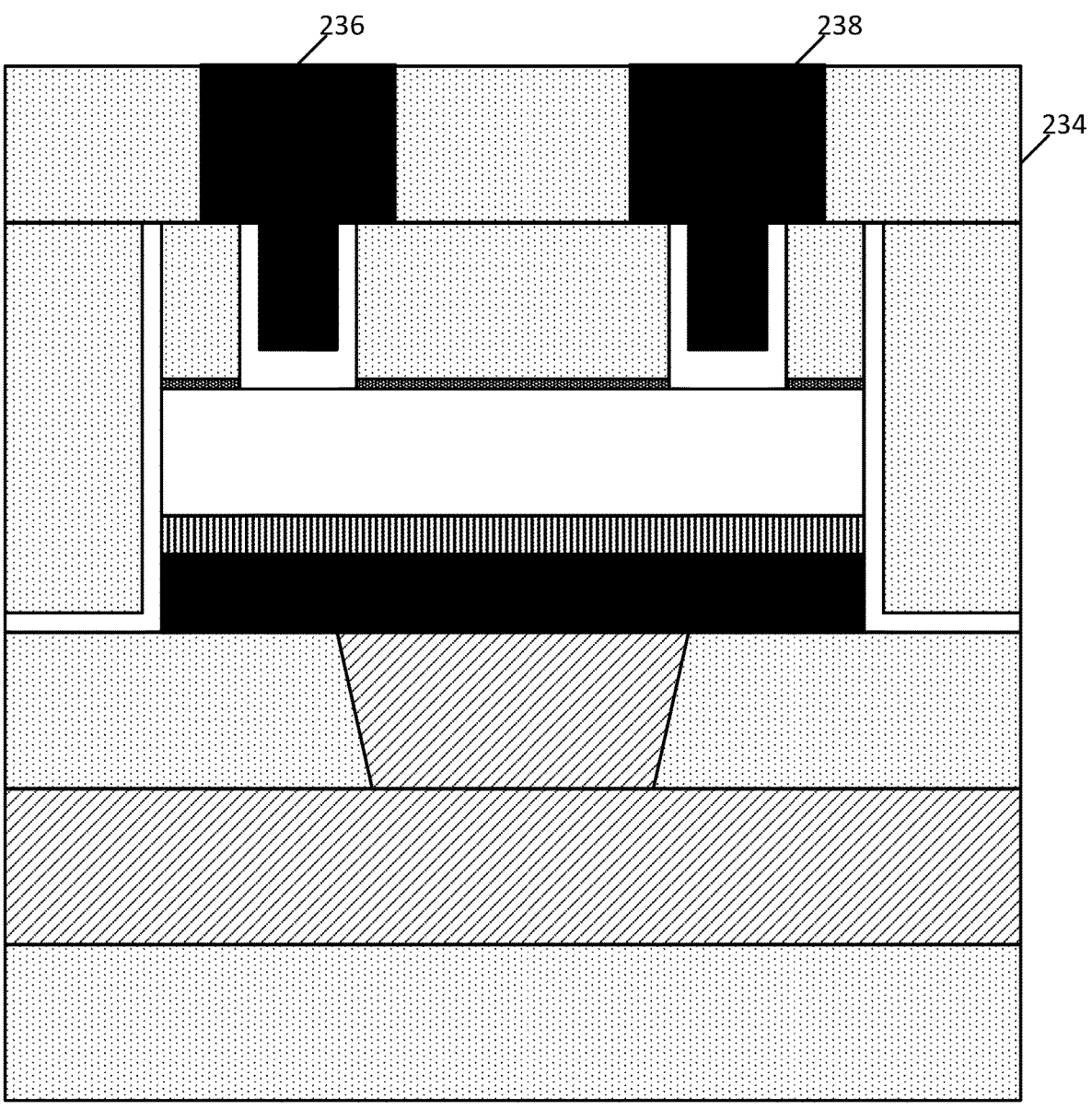

FIG. 2I is a cross-sectional view of the structure depicted in FIG. 2H following the formation of another interconnect layer 234 over the TFT structure. Interconnect layer 234 formed over the TFT structure includes a second conductive trace 236, a conductive via 238, and dielectric material surrounding the conductive features. The surrounding dielectric material may be similar to any other dielectric material (e.g., silicon dioxide or porous silicon dioxide) found in any of the other interconnect layers (such as dielectric material 112).

Second conductive trace 236 may be formed, for example, by first forming a recess within the surrounding dielectric material followed by filling the recess with a conductive material, such as copper, that is deposited using any one of electroplating, electroless plating, CVD, or PECVD, to name a few examples. After deposition of the conductive material within the recess, a polishing process may be performed using, for example, CMP to planarize a top surface of second conductive trace 236 with the surrounding dielectric material. In some embodiments, a thin barrier layer is conformally deposited (e.g., via ALD or CVD) first along the inner surfaces of the recess prior to the deposition of the remaining conductive material. The thin barrier layer may include, for example, tantalum or titanium, or a nitride of these. As discussed above, second conductive trace 236 may be one bitline of a plurality of parallel bitlines formed in the interconnect layer over the TFT structure. Accordingly, second conductive trace 236 may run into and out of the page orthogonally to first conductive trace 204. Second conductive trace 236 conductively contacts one of the contacts of the illustrated TFT structure and further contacts at least one of the contacts of other TFT structures along a row extending into and out of the page, according to some embodiments. Conductive via 238 may be conductively coupled only to one or more contacts of the illustrated TFT structure (and not coupled to any contacts of any other TFT structures). Conductive via 238 may include the same material composition and deposition process as second conductive trace 236.

Figure 2J:
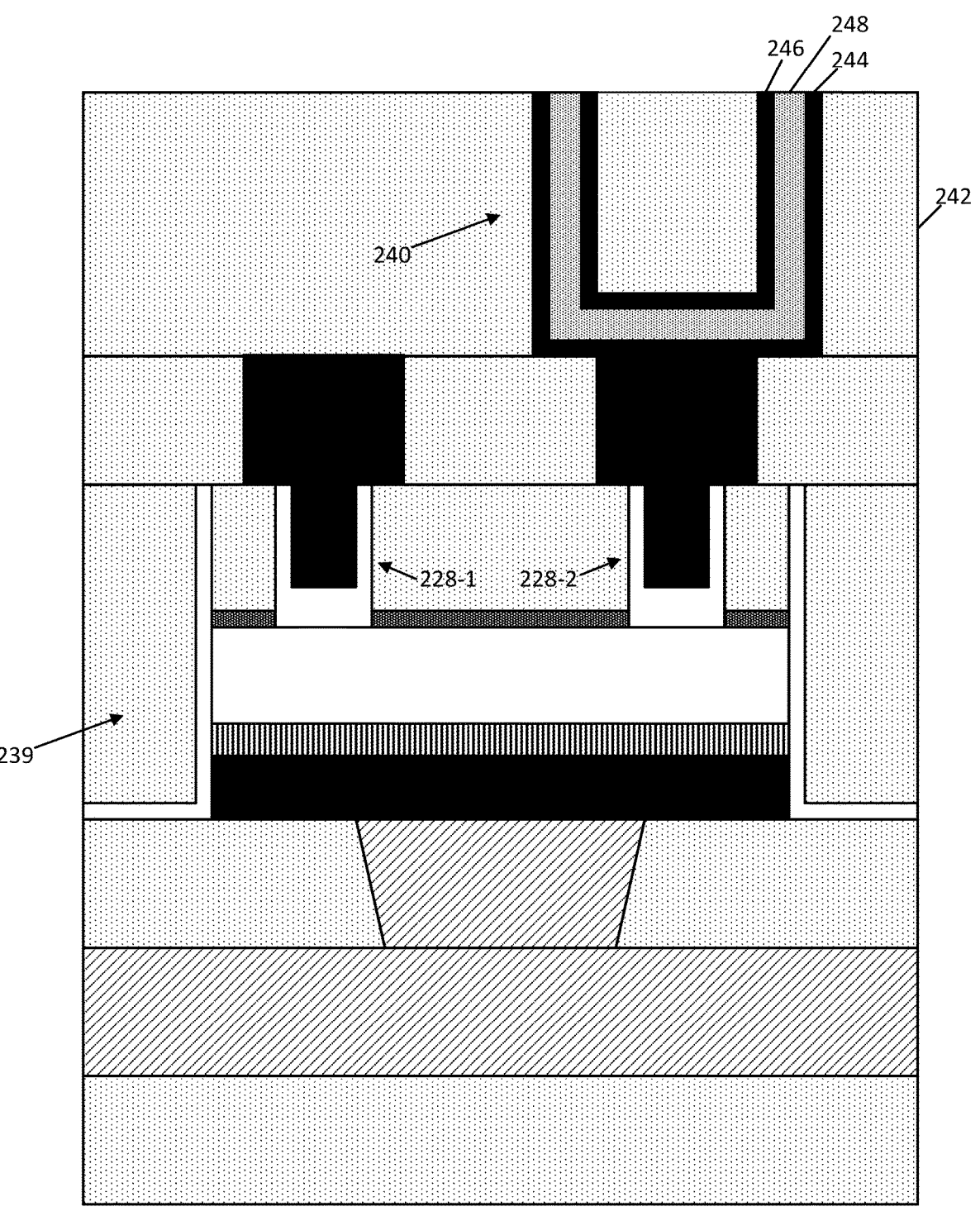

FIG. 2J is a cross-sectional view of the structure depicted in FIG. 2I following the formation of a capacitor 240 coupled to conductive via 238. As previously discussed, the TFT structure 239 is coupled to a corresponding capacitor 240 within another interconnect layer 242, and TFT structure 239 and capacitor 240, in combination, form or are part of a single memory structure (e.g., an eDRAM cell).

In the memory structure, capacitor 240 stores a bit of information and TFT structure 239 allows for writing and reading that bit. For example, capacitor 240 can either be charged to a first state or discharged to a second state, and these two states represent two bit values of 0 or 1. As illustrated in FIG. 2J, capacitor 240 comprises a first electrode 244 and a second electrode 246. Electrodes 244 and 246 may be formed in a 'U' shape as illustrated to provide a high opposing surface area between the electrodes. In other embodiments, capacitor 240 may have a different shape or configuration. For instance, rather than being U-shaped, capacitor 240 may have a relatively flat configuration with upper and lower electrodes, or a pillar-shaped configuration with inner and outer electrodes. In one embodiment, electrodes 244 and 246 may include any suitable electrically conductive material, such as a metal or metal alloy material including, e.g., copper, silver, aluminum, tantalum, aluminum, tungsten, nickel, platinum, molybdenum, manganese, or an alloy thereof, such as titanium nitride, tantalum nitride, titanium aluminum nitride, molybdenum oxide, manganese oxide, ruthenium, tungsten oxide, or another appropriate conductive material.

According to some embodiments, one or more dielectric layers 248 are formed on electrode 244, prior to the formation of electrode 246. One or more dielectric layers 248 include any suitable dielectric material and form the "I" part of the MIM (metal-insulator-metal) capacitor 240. Note that one or more dielectric layers 248 may include one or more distinct and/or compositionally different layers of dielectric material. For example, one or more dielectric layers 248 may include one or more thin films of one or more metal oxides, such as one or more oxides of hafnium, aluminum, zirconium, titanium, tantalum, or another appropriate metal.

It should be understood that the contacts of TFT structure 239 do not need to have the same layer structure. For example, contact 228-2 may include more and/or thicker semiconductor layers compared to contact 228-1.

Figure 3:
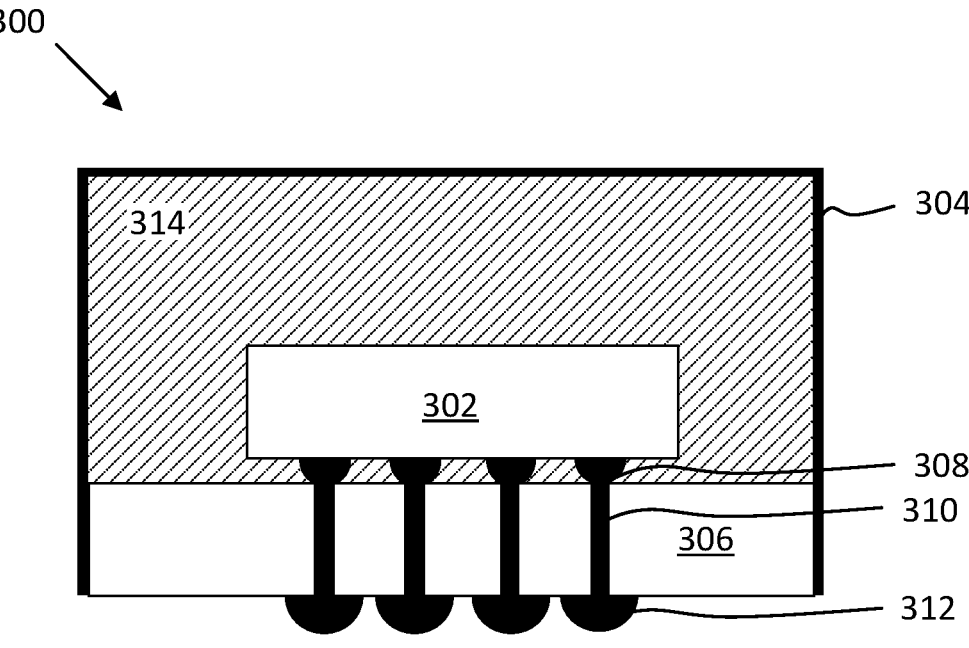
FIG. 3 illustrates a cross-section view of a chip package containing one or more semiconductor dies, in accordance with some embodiments of the present disclosure.

FIG. 3 illustrates an example embodiment of a chip package 300, in accordance with an embodiment of the present disclosure. As can be seen, chip package 300 includes one or more dies 302. One or more dies 302 may include at least one integrated circuit having a structure as described in any of the aforementioned embodiments. One or more dies 302 may include any other circuitry used to interface with other devices formed on the dies, or other devices connected to chip package 300, in some example configurations.

As can be further seen, chip package 300 includes a housing 304 that is bonded to a package substrate 306. The housing 304 may be any standard or proprietary housing, and may provide, for example, electromagnetic shielding and environmental protection for the components of chip package 300. The one or more dies 302 may be conductively coupled to a package substrate 306 using connections 308, which may be implemented with any number of standard or proprietary connection mechanisms, such as solder bumps, ball grid array (BGA), pins, or wire bonds, to name a few examples. Package substrate 306 may be any standard or proprietary package substrate, but in some cases includes a dielectric material having conductive pathways (e.g., including conductive vias and lines) extending through the dielectric material between the faces of package substrate 306, or between different locations on each face. In some embodiments, package substrate 306 may have a thickness less than 1 millimeter (e.g., between 0.1 millimeters and 0.5 millimeters), although any number of package geometries can be used. Additional conductive contacts 312 may be disposed at an opposite face of package substrate 306 for conductively contacting, for instance, a printed circuit board (PCB). One or more vias 310 extend through a thickness of package substrate 306 to provide conductive pathways between one or more of connections 308 to one or more of contacts 312. Vias 310 are illustrated as single straight columns through package substrate 306 for ease of illustration, although other configurations can be used (e.g., damascene, dual damascene, through-silicon via, or an interconnect structure that meanders through the thickness of substrate 306 to contact one or more intermediate locations therein). In still other embodiments, vias 310 are fabricated by multiple smaller stacked vias, or are staggered at different locations across package substrate 306. In the illustrated embodiment, contacts 312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 312, to inhibit shorting.

In some embodiments, a mold material 314 may be disposed around the one or more dies 302 included within housing 304 (e.g., between dies 302 and package substrate 306 as an underfill material, as well as between dies 302 and housing 304 as an overfill material). Although the dimensions and qualities of the mold material 314 can vary from one embodiment to the next, in some embodiments, a thickness of mold material 314 is less than 1 millimeter. Example materials that may be used for mold material 314 include epoxy mold materials, as suitable. In some cases, the mold material 314 is thermally conductive, in addition to being electrically insulating.

Methodology

Figure 4:
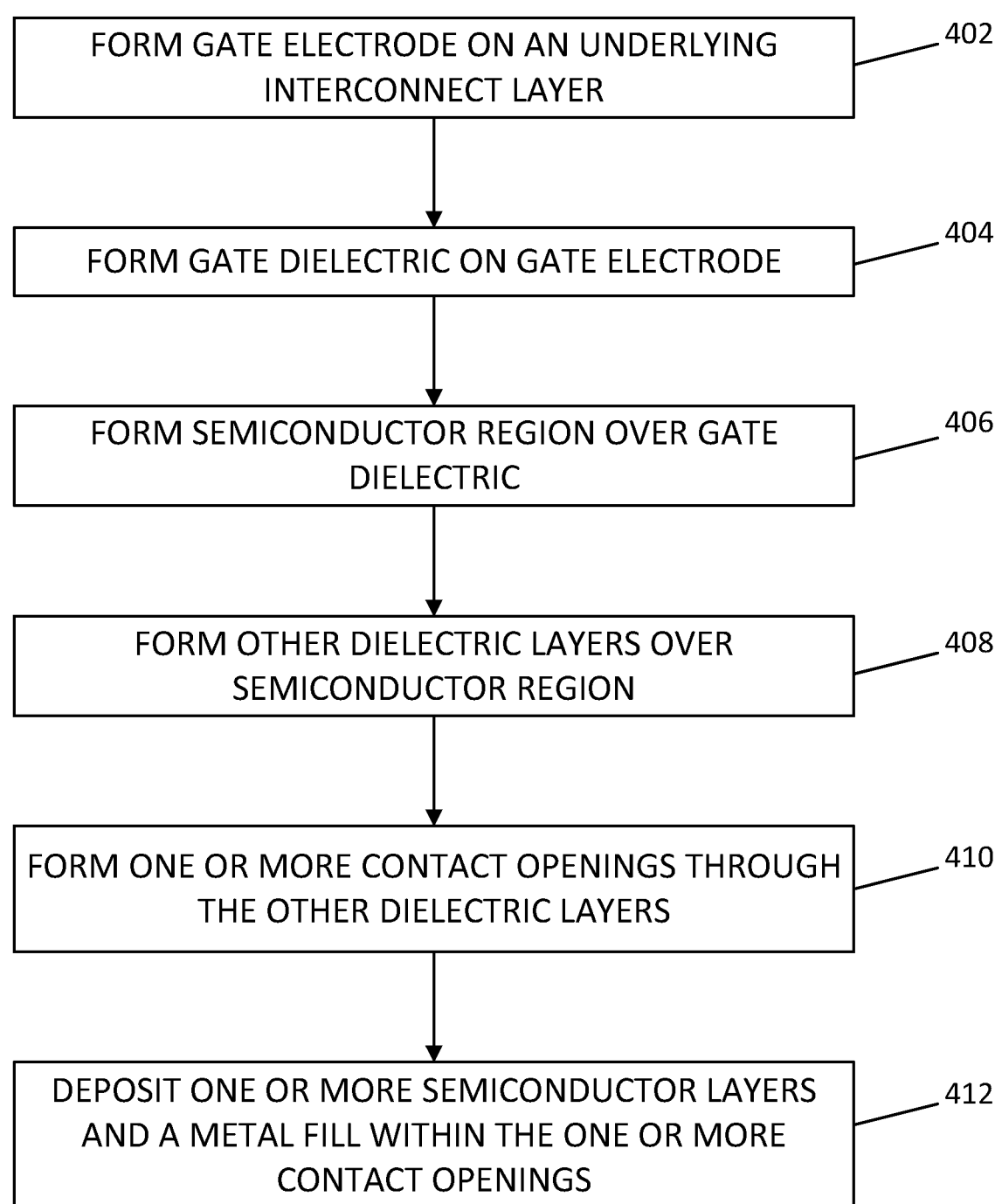
FIG. 4 is a flowchart of a method for forming a TFT having a multi-layer contact structure, in accordance with an embodiment of the present disclosure.

FIG. 4 is a flow chart of a method 400 for forming at least a portion of an integrated circuit having a TFT configured with contacts as variously described herein, according to an embodiment. Various operations of method 400 may be illustrated in FIGS. 2A-2K. However, the correlation of the various operations of method 400 to the specific components illustrated in the aforementioned figures is not intended to imply any structural and/or use limitations. Rather, the aforementioned figures provide one example embodiment of method 400. Other operations may be performed before, during, or after any of the operations of method 400. Some of the operations of method 400 may be performed in a different order than the illustrated order. In some embodiments, the various operations of method 400 are performed during back end-of-the-line (BEOL) processing, such as DRAM formation within an interconnect structure.

Method 400 begins with operation 402 where a gate electrode is formed on an underlying interconnect layer within an interconnect region. According to some embodiments, the gate electrode is formed directly on an underlying conductive via while in other embodiments the gate electrode is formed directly on an underlying conductive trace (e.g., a wordline). The gate electrode may include any suitable conductive material such as polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may contain multiple layers, such as an inner plug or fill metal, with surrounding or outer work function material. According to some embodiments, the gate electrode includes one or more n-type work function metals such as platinum, gold, palladium, or cobalt. In some embodiments, the gate electrode includes one or more p-type work function metals such as titanium, titanium nitride, tantalum, or tantalum nitride. The gate electrode may be deposited any suitable deposition technique, such as CVD, PVD, electroplating, or electroless plating.

Method 400 continues with operation 404 where a gate dielectric is formed over the gate electrode. The gate dielectric may be deposited, for example, to a thickness between about 2 nm and about 10. The gate dielectric may include any suitable dielectric material (such as silicon dioxide, and/or a high-k dielectric material) and deposited using any suitable deposition process, such as CVD, ALD, flowable CVD, or spin-on dielectric. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide. In some cases, the gate dielectric may include multiple different layers, such as a first layer of high-k material (e.g., hafnium oxide) on the gate electrode and at least one other layer of lower-k oxide between the first layer and the semiconductor region that is ultimately formed over the gate dielectric.

Method 400 continues with operation 406 where a semiconductor region is formed over the gate dielectric. The semiconductor region may include any suitable semiconductor material, such as silicon or any III-V or II-VI materials exhibiting semiconducting qualities. The semiconductor region may be deposited to a thickness between about 5 nm and about 16 nm using any suitable deposition technique, such as CVD, PECVD, PVD, ALD, or epitaxial growth, to name a few examples. According to some embodiments, the semiconductor region includes a plurality of deposited semiconductor layers.

Method 400 continues with operation 408 where other dielectric layers are formed over the semiconductor region. According to some embodiments, the other dielectric layers include a passivation layer having a dielectric material that protects the underlying semiconductor region. The passivation layer may include, for example, aluminum oxide, although other metal oxides may be used as well. Any number of passivation and/or interlayer dielectrics (ILD) can be deposited over the passivation layer. According to some embodiments, any of the other dielectric layers may include silicon oxide, silicon oxycarbide, silicon nitride, or silicon oxynitride, to name a few examples.

Method 400 continues with operation 410 where one or more contact openings are formed through at least the other dielectric layers. In some embodiments, the one or more contact openings may also be formed through a portion of a thickness of the semiconductor region. According to one example, an anisotropic etching process may be performed through the other dielectric layers to expose at least a portion of the underlying semiconductor region.

Method 400 continues with operation 412 where one or more conductive contacts are formed within the one or more contact openings, such that at least a portion of the one or more conductive contacts lands upon respective one or more portions of the semiconductor region. As discussed above, the conductive contacts may include one or more contact semiconductor layers and a metal fill. The metal fill may be formed within any remaining volume of the contact opening following the formation of the contact semiconductor layers. In some examples, the metal fill is formed using electroplating.

Each of the contact semiconductor layers may be deposited using any suitable deposition technique, such as CVD, PVD and/or ALD. In some embodiments, the deposited contact semiconductor layers have similar elements to the material used in the semiconductor region, but with differing concentrations to impart different characteristics to each layer. For example, elements such as gallium, indium, or zinc may have higher or lower concentrations in successive contact semiconductor layers. Other metal semiconductor elements can be used as well. In some embodiments, a topmost layer of the contact semiconductor layers is highly doped and thus more conductive compared to any of the other layers of the contact semiconductor layers. In some embodiments, the topmost layer of the contact semiconductor layers includes any semiconductor material or doping profile to create a narrower bandgap compared to any of the other layers of the contact semiconductor layers. In some embodiments, any of the contact semiconductor layers includes a graded concentration of one or more metal semiconductor elements throughout a thickness of the layer.

Example System

Figure 5:
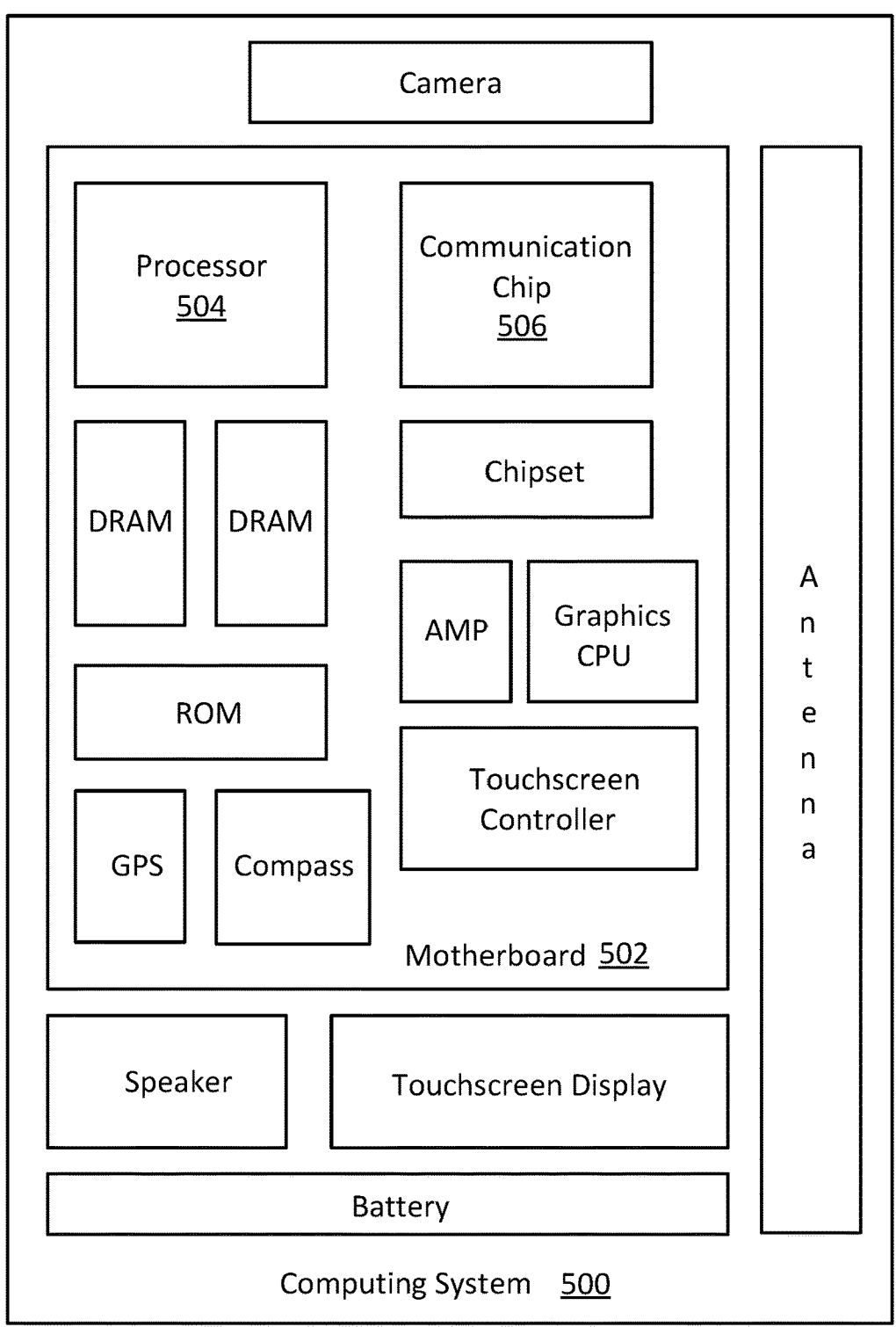
FIG. 5 illustrates a computing system including one or more integrated circuits, as variously described herein, in accordance with an embodiment of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board (PCB), whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., a module including an integrated circuit having interconnect structures that include tiers of backend memory cells having multilayer contacts, or TFT structures having multilayer contacts). In some embodiments, the inclusion of the backend memory cells may reduce the number of other DRAM chips included within computing system 500. In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing system 500 includes an integrated circuit die packaged within the processor 504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more semiconductor devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 500 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit that includes a gate electrode, a gate dielectric on the gate electrode, a semiconductor region on the gate dielectric, and a conductive contact that contacts at least a portion of the semiconductor region. The conductive contact includes a multilayer structure having at least a first material layer on the at least a portion of the semiconductor region, at least a second material layer on the first material layer, and a conductive fill material over the first and second material layers.

Example 2 includes the subject matter of Example 1, further comprising a passivation layer over the semiconductor region, such that the conductive contact extends through an entire thickness of the passivation layer.

Example 3 includes the subject matter of Example 2, wherein the passivation layer comprises aluminum and oxygen.

Example 4 includes the subject matter of any one of Examples 1-3, wherein the conductive contact is a first conductive contact of a thin film transistor (TFT) structure and the TFT structure comprises a second conductive contact that contacts at least a portion of the semiconductor region, wherein the second conductive contact also comprises a multilayer structure.

Example 5 includes the subject matter of any one of Examples 1-4, wherein the semiconductor region and the first material layer each include a plurality of same elements, wherein one of the elements has a higher concentration in the first material layer compared to the semiconductor region.

Example 6 includes the subject matter of any one of Examples 1-5, wherein the semiconductor region comprises oxygen, indium, gallium, and zinc.

Example 7 includes the subject matter of Example 6, wherein the first material layer comprises oxygen, indium, gallium, and zinc, with a higher concentration of indium or gallium compared to the semiconductor region.

Example 8 includes the subject matter of Example 7, wherein the second material layer comprises oxygen, indium, gallium, and zinc, with a higher concentration of indium or gallium compared to the first material layer.

Example 9 includes the subject matter of any one of Examples 1-8, wherein the conductive fill comprises a metal.

Example 10 includes the subject matter of any one of Examples 1-9, wherein the first material layer and the second material layer each have a thickness between about 0.5 nm and about 10 nm.

Example 11 includes the subject matter of any one of Examples 1-10, wherein each of the gate electrode, the gate dielectric, the semiconductor region on the gate dielectric, and the conductive contact is part of a transistor structure that is part of an array of transistor structures within an interconnect structure.

Example 12 is a printed circuit board having the integrated circuit of any one of Examples 1-11.

Example 13 is an integrated circuit including a plurality of semiconductor devices, an interconnect region above the plurality of semiconductor devices and including a plurality of stacked interconnect layers, and a thin film transistor (TFT) structure across one or more interconnect layers of the plurality of stacked interconnect layers. The TFT structure includes a gate electrode, a gate dielectric on the gate electrode, a semiconductor region on the gate dielectric, and a conductive contact that contacts at least a portion of the semiconductor region. The conductive contact includes a multilayer structure having at least a first material layer on the at least a portion of the semiconductor region, at least a second material layer on the first material layer, and a conductive fill material over the first and second material layers.

Example 14 includes the subject matter of Example 13, wherein the TFT structure further comprises a passivation layer over the semiconductor region, such that the conductive contact extends through an entire thickness of the passivation layer.

Example 15 includes the subject matter of Example 14, wherein the passivation layer comprises aluminum and oxygen.

Example 16 includes the subject matter of any one of Examples 13-15, wherein the conductive contact is a first conductive contact and the TFT structure comprises a second conductive contact that contacts at least a portion of the semiconductor region, wherein the second conductive contact also comprises a multilayer structure.

Example 17 includes the subject matter of any one of Examples 13-16, wherein the semiconductor region and the first material layer each include a plurality of same elements, wherein one of the elements has a higher concentration in the first material layer compared to the semiconductor region.

Example 18 includes the subject matter of any one of Examples 13-17, wherein the semiconductor region comprises oxygen, indium, gallium, and zinc.

Example 19 includes the subject matter of Example 18, wherein the first material layer comprises oxygen, indium, gallium, and zinc, with a higher concentration of indium or gallium compared to the semiconductor region.

Example 20 includes the subject matter of Example 19, wherein the second material layer comprises oxygen, indium, gallium, and zinc, with a higher concentration of indium or gallium compared to the first material layer.

Example 21 includes the subject matter of any one of Examples 13-20, wherein the conductive fill comprises a metal.

Example 22 includes the subject matter of any one of Examples 13-21, wherein the first material layer and the second material layer each have a thickness between about 0.5 nm and about 10 nm.

Example 23 includes the subject matter of any one of Examples 13-22, wherein the TFT structure is one TFT structure of an array of TFT structures within the interconnect region.

Example 24 is a printed circuit board having the integrated circuit of any one of Examples 13-23.

Example 25 is an electronic device having a chip package with one or more dies. At least one of the one or more dies includes a plurality of semiconductor devices, an interconnect region above the plurality of semiconductor devices and including a plurality of stacked interconnect layers, and a thin film transistor (TFT) structure across one or more interconnect layers of the plurality of stacked interconnect layers. The TFT structure includes a gate electrode, a gate dielectric on the gate electrode, a semiconductor region on the gate dielectric, and a conductive contact that contacts at least a portion of the semiconductor region. The conductive contact includes a multilayer structure having at least a first material layer on the at least a portion of the semiconductor region, at least a second material layer on the first material layer, and a conductive fill material over the first and second material layers.

Example 26 includes the subject matter of Example 25, wherein the TFT structure further comprises a passivation layer over the semiconductor region, such that the conductive contact extends through an entire thickness of the passivation layer.

Example 27 includes the subject matter of Example 26, wherein the passivation layer comprises aluminum and oxygen.

Example 28 includes the subject matter of any one of Examples 25-27, wherein the conductive contact is a first conductive contact and the TFT structure comprises a second conductive contact that contacts at least a portion of the semiconductor region, wherein the second conductive contact also comprises a multilayer structure.

Example 29 includes the subject matter of any one of Examples 25-28, wherein the semiconductor region and the first material layer each include a plurality of same elements, wherein one of the elements has a higher concentration in the first material layer compared to the semiconductor region.

Example 30 includes the subject matter of any one of Examples 25-29, wherein the semiconductor region comprises oxygen, indium, gallium, and zinc.

Example 31 includes the subject matter of Example 30, wherein the first material layer comprises oxygen, indium, gallium, and zinc, with a higher concentration of indium or gallium compared to the semiconductor region.

Example 32 includes the subject matter of Example 31, wherein the second material layer comprises oxygen, indium, gallium, and zinc, with a higher concentration of indium or gallium compared to the first material layer.

Example 33 includes the subject matter of any one of Examples 25-32, wherein the conductive fill comprises a metal.

Example 34 includes the subject matter of any one of Examples 25-33, wherein the first material layer and the second material layer each have a thickness between about 0.5 nm and about 10 nm.

Example 35 includes the subject matter of any one of Examples 25-34, wherein the TFT structure is one TFT structure of an array of TFT structures within the interconnect region.

Example 36 includes the subject matter of any one of Examples 25-35, further comprising a printed circuit board, wherein the chip package is coupled to the printed circuit board.

Example 37 is a method of forming an integrated circuit. The method includes forming a gate electrode on an underlying interconnect layer within an interconnect region over a plurality of semiconductor devices; forming a gate dielectric on the gate electrode; forming a semiconductor region on the gate dielectric; forming one or more dielectric layers over the semiconductor region; etching a recess through the one or more dielectric layers such that the recess exposes at least a portion of the semiconductor region; forming a first material layer within the recess and contacting the at least a portion of the semiconductor region; forming a second material layer on the first material layer within the recess; and forming a conductive fill within a remaining volume of the recess.

Example 38 includes the subject matter of Example 37, wherein forming the first material layer comprises forming the first material layer using atomic layer deposition (ALD) and wherein forming the second material layer comprises forming the second material layer using ALD.

Example 39 includes the subject matter of Example 37 or 38, wherein forming the conductive fill comprises electroplating metal within the remaining volume of the recess.

Example 40 includes the subject matter of any one of Examples 37-39, wherein the semiconductor region and the first material layer each include a plurality of same elements, wherein one of the elements has a higher concentration in the first material layer compared to the semiconductor region.

Example 41 includes the subject matter of any one of Examples 37-40, wherein the semiconductor region comprises oxygen, indium, gallium, and zinc.

Example 42 includes the subject matter of Example 41, wherein the first material layer comprises oxygen, indium, gallium, and zinc, with a higher concentration of indium or gallium compared to the semiconductor region.

Example 43 includes the subject matter of Example 42, wherein the second material layer comprises oxygen, indium, gallium, and zinc, with a higher concentration of indium or gallium compared to the first material layer.

Example 44 includes the subject matter of any one of Examples 37-43, wherein the underlying interconnect layer comprises a conductive layer, and wherein forming the gate electrode comprises forming the gate electrode on the conductive layer.

Example 45 is an integrated circuit that includes a gate electrode, a gate dielectric on the gate electrode, a semiconductor region on the gate dielectric, and a conductive contact that contacts at least a portion of the semiconductor region. The conductive contact includes (1) a graded material layer on the at least a portion of the semiconductor region and (2) a conductive fill material over the graded material layer, wherein the graded material layer comprises a concentration gradient of a given element having a first concentration at an interface with the conductive fill and a second concentration at an interface with the semiconductor region, the first concentration being different than the second concentration.

Example 46 includes the subject matter of Example 45, further comprising a passivation layer over the semiconductor region, such that the conductive contact extends through an entire thickness of the passivation layer.

Example 47 includes the subject matter of Example 46, wherein the passivation layer comprises aluminum and oxygen.

Example 48 includes the subject matter of any one of Examples 45-47, wherein the conductive contact is a first conductive contact of a thin film transistor (TFT) structure, and the TFT structure comprises a second conductive contact that contacts at least a portion of the semiconductor region, wherein the second conductive contact comprises a same multilayer structure as the first conductive contact.

Example 49 includes the subject matter of any one of Examples 45-48, wherein the semiconductor region and the graded material layer each include a plurality of same elements.

Example 50 includes the subject matter of any one of Examples 45-49, wherein the semiconductor region comprises oxygen, indium, gallium, and zinc.

Example 51 includes the subject matter of Example 50, wherein the graded material layer comprises oxygen, indium, gallium, and zinc, with indium or gallium being the given element.

Example 52 includes the subject matter of any one of Examples 45-51, wherein the conductive fill comprises a metal.

Example 53 includes the subject matter of any one of Examples 45-52, wherein the graded material layer has a thickness between about 1.0 nm and about 20 nm.

Example 54 includes the subject matter of any one of Examples 45-53, wherein each of the gate electrode, gate dielectric, semiconductor region and conductive contact are part of a thin film transistor (TFT) structure that is within an interconnect region that is above a device layer, and the TFT structure is one TFT structure of an array of TFT structures within the interconnect region.

Example 55 is a printed circuit board comprising the integrated circuit of any one of Examples 45-54.

The foregoing description of the embodiments of the disclosure has been presented for the purposes of illustration and description. It is not intended to be exhaustive or to limit the disclosure to the precise forms disclosed. Many modifications and variations will be apparent in light of this disclosure. It is intended that the scope of the disclosure be limited not by this detailed description, but rather by the claims appended hereto.

What is claimed is:

1. An integrated circuit, comprising:
a gate electrode,
a gate dielectric on the gate electrode,
a semiconductor region on the gate dielectric, and
a conductive contact that contacts at least a portion of the semiconductor region,
wherein the conductive contact comprises a multilayer structure having at least a first material layer on the at least a portion of the semiconductor region, at least a second material layer on the first material layer, and a conductive fill material over the first and second material layers, wherein the semiconductor region and the first material layer each includes a plurality of same elements, and wherein one of the elements has a higher concentration in the first material layer compared to the semiconductor region.

2. The integrated circuit of claim 1, wherein the conductive contact is a first conductive contact of a thin film transistor (TFT) structure and the TFT structure comprises a second conductive contact that contacts at least a portion of the semiconductor region, wherein the second conductive contact also comprises a multilayer structure.

3. The integrated circuit of claim 1, wherein each of the gate electrode, the gate dielectric, the semiconductor region on the gate dielectric, and the conductive contact is part of a transistor structure that is part of an array of transistor structures within an interconnect structure.

4. A printed circuit board comprising the integrated circuit of claim 1.

5. The integrated circuit of claim 1, wherein the first material layer and the second material layer each has a thickness between 0.5 nm and 10 nm.

6. The integrated circuit of claim 1, wherein the semiconductor region comprises oxygen, indium, gallium, and zinc.

7. The integrated circuit of claim 6, wherein the first material layer comprises oxygen, indium, gallium, and zinc, with a higher concentration of indium or gallium compared to the semiconductor region.

8. The integrated circuit of claim 7, wherein the second material layer comprises oxygen, indium, gallium, and zinc, with a higher concentration of indium or gallium compared to the first material layer.

9. An integrated circuit, comprising:
a plurality of semiconductor devices;
an interconnect region above the plurality of semiconductor devices, the interconnect region comprising a plurality of stacked interconnect layers; and
a thin film transistor (TFT) structure across one or more interconnect layers of the plurality of stacked interconnect layers, the TFT structure comprising
a gate electrode,
a gate dielectric on the gate electrode,
a semiconductor region on the gate dielectric, and
a conductive contact that contacts at least a portion of the semiconductor region,
wherein the conductive contact comprises a multilayer structure having at least a first material layer on the at least a portion of the semiconductor region, at least a second material layer on the first material layer, and a conductive fill material over the first and second material layers.

10. The integrated circuit of claim 9, wherein the semiconductor region and the first material layer each include a plurality of same elements, wherein one of the elements has a higher concentration in the first material layer compared to the semiconductor region.

11. The integrated circuit of claim 9, wherein the TFT structure is one TFT structure of an array of TFT structures within the interconnect region.

12. A printed circuit board comprising the integrated circuit of claim 9.

13. The integrated circuit of claim 9, wherein the semiconductor region comprises oxygen, indium, gallium, and zinc.

14. The integrated circuit of claim 13, wherein the first material layer comprises oxygen, indium, gallium, and zinc, with a higher concentration of indium or gallium compared to the semiconductor region.

15. The integrated circuit of claim 14, wherein the second material layer comprises oxygen, indium, gallium, and zinc, with a higher concentration of indium or gallium compared to the first material layer.

16. An integrated circuit, comprising:
a gate electrode,
a gate dielectric on the gate electrode,
a semiconductor region on the gate dielectric, and a conductive contact that contacts at least a portion of the semiconductor region, wherein the conductive contact comprises (1) a graded material layer on the at least a portion of the semiconductor region and (2) a conductive fill material over the graded material layer, wherein the graded material layer comprises a concentration gradient of a given element having a first concentration at an interface with the conductive fill and a second concentration at an interface with the semiconductor region, the first concentration being different than the second concentration.

17. The integrated circuit of claim 16, wherein the semiconductor region and the graded material layer each include a plurality of same elements.

18. A printed circuit board comprising the integrated circuit of claim 16.

19. The integrated circuit of claim 16, wherein the semiconductor region comprises oxygen, indium, gallium, and zinc.

20. The integrated circuit of claim 19, wherein the graded material layer comprises oxygen, indium, gallium, and zinc, with indium or gallium being the given element.

* * * * *